US012775022B2

(12) United States Patent
Jang

(10) Patent No.: US 12,775,022 B2
(45) Date of Patent: Oct. 27, 2026

(54) PROBE-HEAD FOR ELECTRICAL DEVICE INSPECTION AND MANUFACTURING METHOD THEREOF

(71) Applicant: NANO-X CO., LTD, Suwon-si (KR)

(72) Inventor: Pil Kuk Jang, Seoul (KR)

(73) Assignee: NANO-X CO., LTD, Suwon-si (KR)

( * ) Notice: Subject to any disclaimer, the term of this patent is extended or adjusted under 35 U.S.C. 154(b) by 160 days.

(21) Appl. No.: 18/862,548

(22) PCT Filed: May 3, 2023

(86) PCT No.: PCT/KR2023/006010

§ 371 (c)(1),
(2) Date: Nov. 3, 2024

(87) PCT Pub. No.: WO2023/214784

PCT Pub. Date: Nov. 9, 2023

(65) Prior Publication Data

US 2025/0341541 A1 Nov. 6, 2025

(30) Foreign Application Priority Data

May 3, 2022 (KR) ........................ 10-2022-0054920

(51) Int. Cl.
*G01R 1/067* (2006.01)
*G01R 1/073* (2006.01)
*G01R 3/00* (2006.01)

(52) U.S. Cl.
CPC ..... *G01R 1/06716* (2013.01); *G01R 1/07364* (2013.01); *G01R 3/00* (2013.01)

(58) Field of Classification Search
CPC .............. G01R 1/0735; G01R 1/07342; G01R 1/07378; G01R 1/06727
See application file for complete search history.

(56) References Cited

U.S. PATENT DOCUMENTS

2010/0085069 A1* 4/2010 Smith ................ G01R 1/07378 324/755.01
2012/0112779 A1* 5/2012 Smith ................ G01R 1/07342 361/764

FOREIGN PATENT DOCUMENTS

| | | | |
|---|---|---|---|
| CN | 101009268 | A | 8/2007 |
| JP | 2016080514 | A | 5/2016 |
| KR | 200399963 | Y1 | 10/2005 |
| KR | 100787407 | B1 | 12/2007 |
| KR | 200450813 | Y1 | 11/2010 |
| KR | 200458537 | Y1 | 2/2012 |
| KR | 20130127852 | A | 11/2013 |
| KR | 101535179 | B1 | 7/2015 |
| KR | 101689478 | B1 | 12/2016 |

(Continued)

*Primary Examiner* — Noam Reisner

(74) *Attorney, Agent, or Firm* — NKL Law; Jae Youn Kim

(57) ABSTRACT

Disclosed is a probe-head capable of simultaneously inspecting a plurality of devices under test. The probe head includes an elastic body formed by laminating a plurality of elastic layers, with an electrode portion embedded therein. This structure efficiently absorbs shock or load that occurs during contact with the devices under test, preventing damage to both the devices and the probe head. Furthermore, the present invention allows for the simultaneous inspection of multiple electrical devices, significantly reducing inspection time. Additionally, independent elasticity between the probe pins improves inspection stability and reliability.

14 Claims, 36 Drawing Sheets

(56) References Cited

FOREIGN PATENT DOCUMENTS

| | | | | | |
|---|---|---|---|---|---|
| KR | 101996790 | B1 | | 7/2019 | |
| KR | 20210050275 | A | | 5/2021 | |
| KR | 20210050284 | A | | 5/2021 | |
| KR | 102271347 | B1 | * | 6/2021 | ........... G01R 1/0491 |
| KR | 20210151668 | A | | 12/2021 | |

* cited by examiner

S101

<A>

S201

S204

S205

S208

S209

PROBE-HEAD FOR ELECTRICAL DEVICE INSPECTION AND MANUFACTURING METHOD THEREOF

TECHNICAL FIELD

The present invention relates to a probe head for inspecting an electrical device. Specifically, the present invention relates to a probe head for inspecting a microscopic electrical device having a size in micrometers (μm) and capable of absorbing shock or load generated during inspection through an elastic body.

BACKGROUND ART

After an electrical device is manufactured, there is a need to connect a test equipment to the electrical device to test its electrical characteristics. Although a person can simply connect the test equipment to the electrodes of the electrical device to perform the test, it is time-consuming and costly for a person to perform the test one by one during the production of a large number of products. Therefore, a probe head that mechanically contacts the electrical device to provide an electrical connection has been developed and used.

However, there is a problem that the probe head may be damaged when the probe head repeatedly contacts the device to be tested, as the impact generated during the contact or the load due to the contact action accumulates. In addition, if the heights of the multiple contact terminals of the device to be tested do not match, there is a problem that it is difficult to test multiple terminals simultaneously because not all terminals are in contact at the same time.

Related Document 1: Korean Utility Model No. 20-0458537 (Registered on Feb. 3, 2012)

Related Document 2: Korean Utility Model No. 20-0399963 (Registered on Oct. 24, 2005)

DISCLOSURE

Technical Problem

The technical problem of the present invention is to provide a probe head capable of measuring a plurality of inspection target devices at the same time.

Another technical problem of the present invention is to efficiently absorb impact or load generated upon contact to prevent damage to the inspection target device and probe head.

Technical Solution

In order to solve the above problem, the present invention provides a probe head characterized by an elastic body formed by stacking a plurality of elastic layers and an electrode part embedded inside the elastic body.

Advantageous Effects

According to the present invention, a plurality of electrical devices can be inspected at the same time, thereby shortening the inspection time required.

In addition, according to the present invention, damage to the inspection target devices is prevented and the durability of the probe head is increased.

Furthermore, the probe head according to the present invention has independent elasticity between each probe pin, thereby further improving inspection stability and inspection reliability.

BEST MODE OF THE INVENTION

Figure 1:
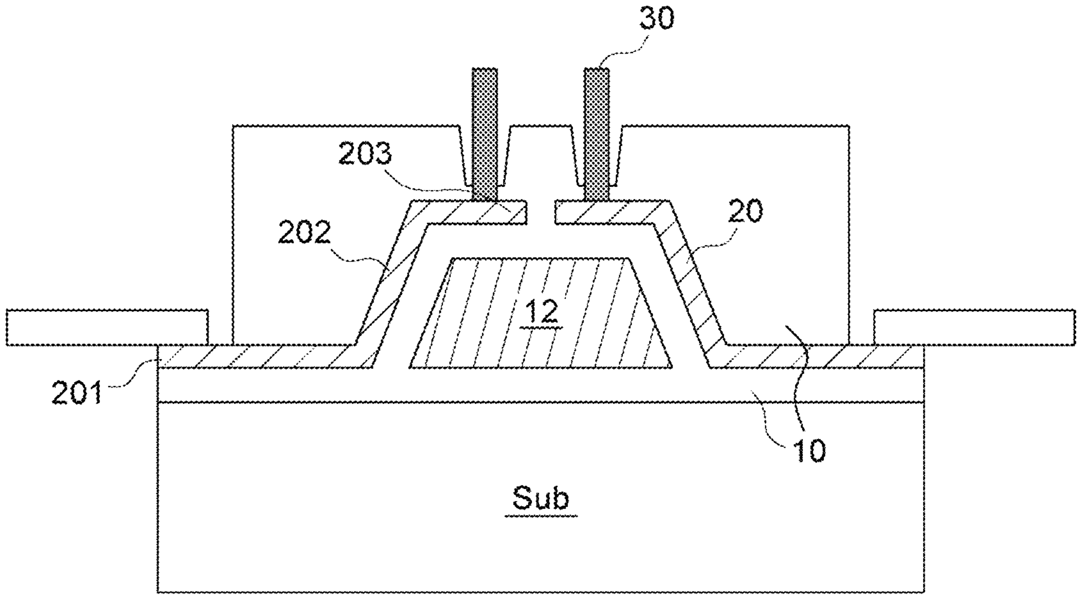
FIG. 1 illustrates a vertical cross-sectional structure of a probe head according to the first embodiment of the present invention.

A probe head comprising: an elastic body (10) formed to a predetermined thickness on an upper surface of a substrate; an electrode portion (20) embedded in the elastic body (10), wherein one end (201) of the electrode portion protrudes beyond a side surface of the elastic body (10); a probe pin (30) having one end connected to the other end (203) of the electrode portion (20) and the other end protruding upward through the elastic body (10); and a second elastic layer (12) embedded in the elastic body (10) and positioned below the other end (203) of the electrode portion (20), wherein the elastic body (10) is made of a material having a lower coefficient of thermal expansion than the second elastic layer (12).

Modes of the Invention

The terms used in this specification will be briefly explained, and an embodiment of the present invention will be specifically explained. The terms used in this specification have been selected as widely used general terms as possible while considering the functions in the present invention, but this may vary depending on the intention of a technician working in the field, precedents, the emergence of new technologies, etc. In addition, in certain cases, there are terms arbitrarily selected by the applicant, and in this case, the meanings thereof will be described in detail in the description of the relevant invention. Therefore, the terms used in this specification should not be simply the names of the terms, but should be defined based on the meanings of the terms and the overall contents of the present invention.

Hereinafter, an embodiment of the present invention will be described in detail with reference to the attached drawings.

FIG. 1 illustrates a vertical cross-sectional structure of a probe head according to the first embodiment of the present invention. In the drawings below, including FIG. 1, 'upper side' is defined as the direction of the surface where the device under test (DUT) comes into contact with the probe head. In addition, the explanation is based on the upper direction of each drawing being the upper side.

The probe head according to the first embodiment of the present invention includes an elastic body (10) formed on the upper surface of a substrate with a predetermined thickness; an electrode part (20) embedded inside the elastic body (10); a probe pin (30) protruding upward from the elastic body (10); and a second elastic layer (12) embedded inside the elastic body (10).

The substrate (Sub) makes it easy to form the structure of the probe head. Also, the substrate (Sub) is configured to support the manufactured probe head.

The substrate (Sub) can be made of the same material as a generally used substrate. Preferably, the substrate (Sub) of the probe head according to the present invention is made of an insulating material and may be provided with a material and thickness having sufficient hardness to withstand the load applied when the probe pin (30) is in contact with the device under test (DUT).

As a preferred embodiment, the substrate (Sub) may be provided with a transparent material having a thickness of about 300 μm. This is to align the probe pin (30) and the device under test. In particular, the material of the substrate (Sub) may be selected from any one of aluminum oxide (Al2O3), glass, quartz, ceramic, and silicon (Si).

The elastic body (10) is configured to absorb and disperse the impact and load applied to the probe head when the device under test and the probe pin (30) come into contact. To this end, the elastic body (10) is laminated in the form of a flat plate having a predetermined thickness on the upper surface of the substrate (Sub) as a synthetic resin material having a predetermined elasticity. Preferably, the elastic body (10) may be provided with a thickness of at least 50 μm or more.

The elastic body (10) may be formed by coating a synthetic resin material on the upper surface of the substrate (Sub). According to one embodiment, the elastic body (10) may be formed on the upper surface of the substrate (Sub) by spin-coating.

Preferably, the elastic body (10) may be a PDMS (polydimethylsiloxane) material. More preferably, the elastic body (10) may be a material that combines PDMS and Si (silicon) series materials and may be a material with improved adhesiveness. Accordingly, a strong bond with the substrate may be formed, thereby improving durability.

In addition, the elastic body (10) is preferably a material having a lower thermal expansion coefficient than the second elastic layer (12). This is because the second elastic layer (12) mainly performs the role of absorbing shock and load, and the elastic body (10) suppresses deformation under thermal or chemical conditions in a semiconductor process to improve quality. In detail, since the probe head is utilized in the semiconductor manufacturing process, it may be exposed to heat generated and chemicals used in the semiconductor manufacturing process. If the second elastic body (10) is deformed by heat, elasticity may be lost and the functions of shock and load absorption may be lost. In addition, since the probe head may be manufactured through a process similar to the semiconductor manufacturing process, the second elastic layer (12) and the electrode portion (20) need to be protected from heat generated and chemicals used in the manufacturing of the probe head.

In particular, if the second elastic layer (12) is deformed by heat, the surface may be formed unevenly, buckled, or cracked. This may make it difficult to deposit the electrode, potentially leading to malfunction or damage of the manufactured probe head.

Preferably, the elastic body (10) may be a synthetic resin material including 1-Methoxy-2-propanol acetate, Modified epoxy acrylate, Aliphatic acrylate, Urethane acrylate, Photo active additives, and Polysiloxane additives. The thermal expansion coefficient of the elastic body (10) is 100 ppm/° C. (Linear CTE by DMA) or less, which is lower than the thermal expansion coefficient Linear CTE (by DMA), 340 ppm/° C., of PDMS, a material that can be used as the second elastic layer (12).

Referring to FIG. 1, since the second elastic layer (12) is embedded within the elastic body (10), the second elastic layer (12) can be protected during a heat generating process such as deposition of the electrode part (20). In addition, since the electrode part (20) is also embedded within the elastic body (10), corrosion of the electrode part (20) due to chemicals can be prevented.

The probe pin (30) is configured to provide an electrical connection with the inspection device by coming into contact with the inspection target device. To this end, the probe pin (30) is provided in the form of a metal pin that protrudes from the upper side of the elastic body (10) and is connected to the electrode part (20). The probe pin (30) may be configured of a metal material such as Cu, Au, Ni, Be, NiCo, NiPd, or BeNi, or a combination thereof.

The electrode part (20) is configured to provide an electrical connection between the probe pin (30) and the inspection device. To this end, the electrode part (20) is provided with a metal material on the upper surface of the substrate (Sub), and a plurality of electrode parts (20) may be appropriately arranged according to the size of the inspection target device and the size of the electrode of the inspection target device. The electrode part (20) may be provided with a material such as a commonly used metal such as Ti, Cr, Cu, Au, or Al, or a combination thereof.

In addition, the electrode part (20) according to the present invention is characterized by being embedded inside the elastic body (10). That is, an elastic body (10) is formed on the upper surface of the substrate (Sub), the electrode part (20) is embedded inside the elastic body (10), and the probe pin (30) vertically penetrates the elastic body (10) from the electrode part (20) and protrudes toward the upper side of the elastic body (10). However, the term 'embedding' here does not mean that the entire electrode part (20) is embedded, and at least a portion of it may be exposed to the outside of the elastic body (10). This is to be electrically connected to the inspection device.

In detail, one end of the electrode part (20) protrudes from the side of the elastic body (10) and is connected to a flexible printed circuit board (F-PCB), and the other end is connected to the probe pin (30). A probe pin (30) is formed to protrude upward from the upper surface of the electrode portion (20), and the probe pin (30) comes into contact with the device to be inspected, thereby forming an electrical connection between the electrode portion (20), the probe pin (30), the flexible printed circuit board (F-PCB), and the inspection target device.

As described above, the second elastic layer (12) is configured to absorb and disperse the impact and load applied to the probe head part. Preferably, the second elastic layer (12) may be a material including at least one selected from the group consisting of elastolefin, thermoplastic olefin, thermoplastic polyurethane, synthetic polyisoprene, chloroprene rubber, styrene-butadiene, epichlorohydrin rubber, polyacrylic rubber, silicone rubber, fluorosilicone rubber, fluoroelastomers, and polydimethylsiloxane.

Preferably, the second elastic layer (12) may be provided in a shape in which the width increases from the upper side to the lower side. Referring to FIG. 1, it can be seen that the second elastic layer (12) has a vertical cross-section in the form of a parallelogram in which the lower side is larger than the upper side. This is to easily distribute the load applied from the upper side to the lower side. Specifically, since the area of the second elastic layer (12) increases toward the lower side, the applied force is distributed to a wider area and the force is prevented from being concentrated only at a narrow point.

In addition, the shape of the second elastic layer (12) makes it easy to form the shape of the electrode part (20) described later. This will be described later with reference to FIGS. 9 and 10.

Figure 2:
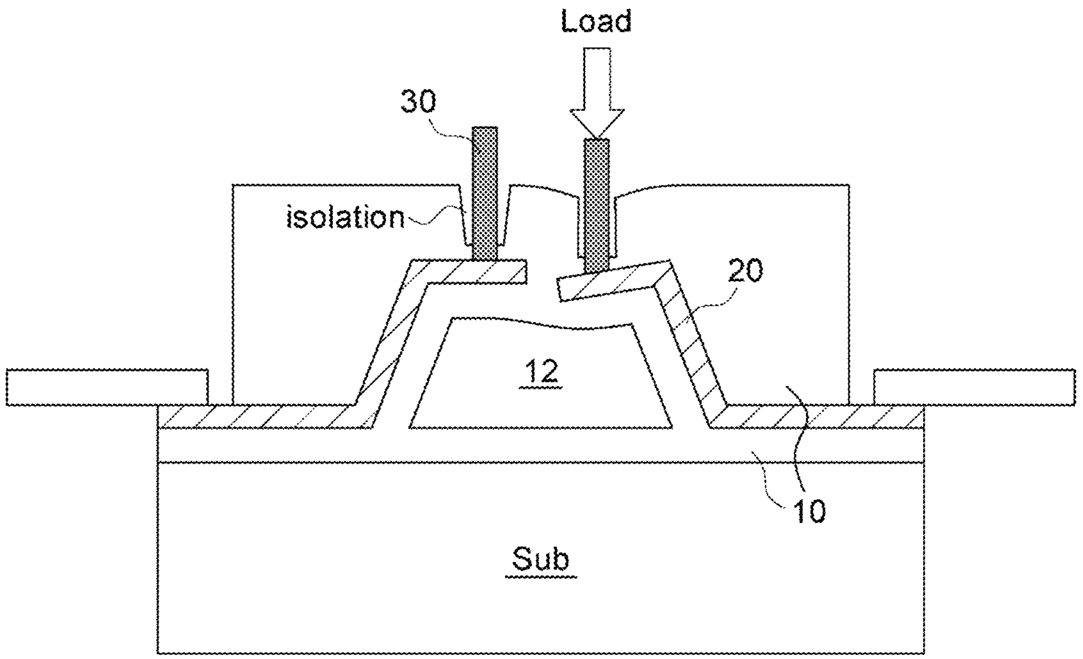
FIG. 2 illustrates a state in which a load is applied to one probe pin of a probe head according to the first embodiment of the present invention.

FIG. 2 shows a state in which a load is applied to one probe pin 30 of the probe head according to the first embodiment of the present invention.

As the electrode part (20) is embedded inside the elastic body (10), when a plurality of electrode parts (20) are provided, each electrode part (20) is insulated to prevent electrical interference between each other.

Figure 3:
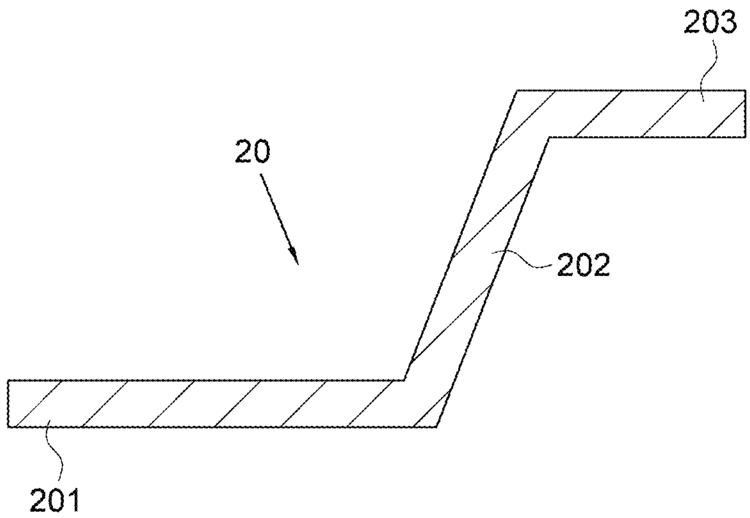
FIG. 3 illustrates a vertical cross-sectional shape of an electrode portion according to the first embodiment of the present invention.

In addition, as shown in FIG. 3, the impact and load that may occur when the device under test (DUT) comes into contact with the probe tip are absorbed and distributed by the elasticity of the elastic portion. Accordingly, damage to the device under test and the probe head is prevented, thereby improving the operational stability of the probe head and enabling the inspection work to be processed quickly.

Preferably, a groove portion may be formed in the elastic body (10). The groove portion is a space between the probe pin (30) and the elastic body (10) formed at a predetermined width from the outer surface of the probe pin (30).

By forming the groove portion (isolation), each probe pin (30) can maintain a microscopic gap with the elastic body (10), thereby reducing friction with the elastic body (10).

Referring to FIG. 2, it can be seen that friction with the elastic layer is prevented even when the probe pin (30) is retracted downward due to the load during measurement (refer to the right probe pin of FIG. 2) and restored to the normal position after measurement (refer to the left probe pin of FIG. 2). Accordingly, the risk of malfunction or damage to the probe head caused by friction with the elastic layer can be reduced.

Furthermore, each probe pin (30) can have an independent elastic force without interference with the adjacent other probe pins (30). Referring to FIG. 2, it can be seen that even if the elastic body (10) is deformed due to the retraction of the probe pin, such as the right probe pin, as the probe pin (30) is separated from the elastic body (10) by the groove portion (isolation), the adjacent probe pin, such as the left probe pin, is not affected.

FIG. 3 shows a vertical cross-sectional shape of the electrode part (20) according to the first embodiment of the present invention.

The electrode part (20) may be provided in a step structure to easily transmit impact and load to the elastic body (10) and the second elastic layer (12).

In detail, one end (201) and the other end (203) of the electrode part (20) are formed at different heights. The height of the other end (203) of the electrode part (20) is located higher than the height of the one end (201), and an inclined part (202) is formed between the one end (201) and the other end (203) of the electrode part (20) whose height increases from the one end (201) to the other end (203).

The reason why the inclined part (202) is formed in a step structure other than a right angle is to disperse the transmitted force and prevent damage to the electrode part (20). If it is provided in a right angle shape, it is difficult to transmit force in the vertical direction, so the force is concentrated on the bent part, which may cause damage to the electrode part (20).

To prevent this, the electrode part (20) is provided in a step structure with an inclined part (202) formed to facilitate the transmission of force. Since the other end (203) and the inclined part (202) are not vertical but form a gentle angle, when an impact or load is applied to the other end (203), the force is easily transmitted to the inclined part (202), and the force is transmitted to the elastic body (10) and the second elastic layer (12) through elastic deformation of the entire electrode part (20).

Figure 4:
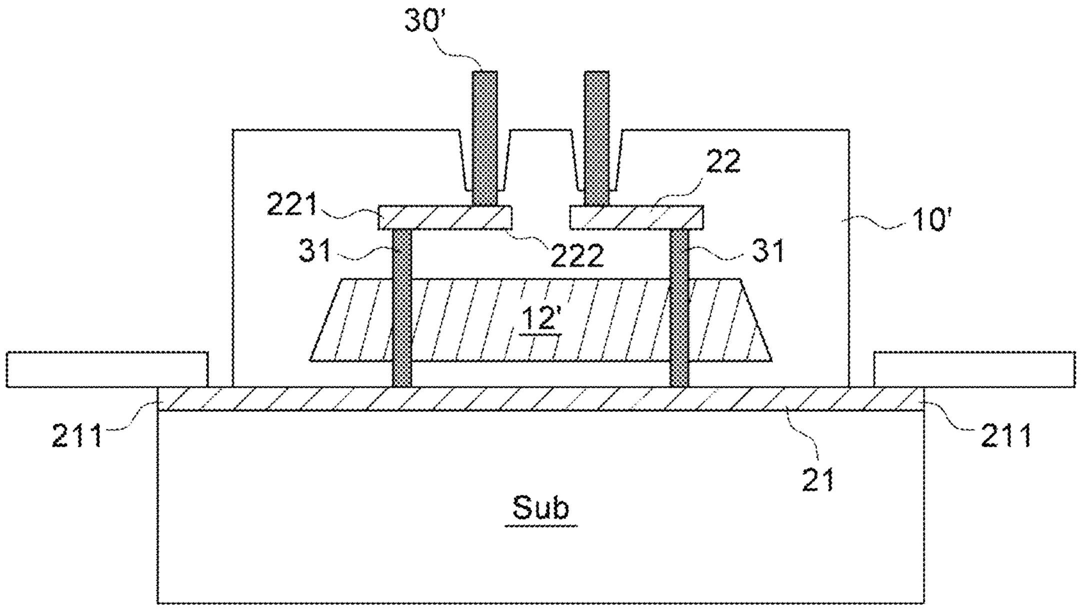
FIG. 4 illustrates a vertical cross-sectional structure of a probe head according to the second embodiment of the present invention.

FIG. 4 shows a vertical cross-sectional structure of a probe head according to a second embodiment of the present invention.

A probe head according to a second embodiment of the present invention comprises: an elastic body (10') formed on an upper surface of a substrate with a predetermined thickness; a first electrode (21) positioned below the elastic body (10'); a second electrode (22) embedded inside the elastic body (10') and positioned above the first electrode (21); a via electrode (31) electrically connecting the first electrode (21) and the second electrode (22); a probe pin (30') protruding upward from the elastic body (10'); and a second elastic layer (12') embedded within the elastic body (10').

The first electrode (21) is a configuration that provides an electrical connection with the inspection device. To this end, the first electrode (21) is provided with a metal material on the upper surface of the substrate (Sub), and a plurality of first electrodes (21) can be appropriately arranged according to the size of the inspection target device and the size of electrodes of the inspection target device. The lateral ends protrude beyond the side surface of the elastic body (10'). The first electrode (21) can be provided with a material of a commonly used metal such as Ti, Cr, Cu, Au, or Al, or a combination thereof.

The elastic body (10') is configured to absorb and disperse the impact and load applied to the probe head when the inspection target device and the probe pin (30') come into contact, as in the first embodiment. To this end, the elastic body (10') is laminated in the form of a flat plate with a predetermined thickness on the upper surface of the substrate (Sub) using a synthetic resin material having a predetermined elasticity. Preferably, the elastic body (10') may be provided with a thickness of at least 50 μm or more.

The elastic body (10') may be formed by coating on the upper surface of the substrate (Sub). According to one embodiment, the elastic layer (10') may be formed on the upper surface of the substrate (Sub) using a spin-coating method.

The second electrode (22) is configured to provide an electrical connection to the probe pin (30') and to transmit an impact or load to the elastic body (10'). Specifically, the second electrode (22) is embedded inside the elastic body (10') and is located on the upper side of the first electrode (21).

The second electrode (22) is electrically connected to the first electrode (21) through the via electrode (31). In detail, the via electrode (31) is formed to vertically penetrate the inside of the elastic body (10') from one end of the second electrode (22) and be electrically connected to the upper surface of the first electrode (21).

One end of the probe pin (30') is connected to the other end of the second electrode (22), and the other end penetrates the elastic body (10') and protrudes toward the upper side of the elastic body (10').

That is, the via electrode (31) is connected to one end of the second electrode (22), and the probe pin (30) is connected to the other end of the second electrode (22). Accordingly, the impact or load applied to the probe pin (30) is not directly transmitted to the via electrode (31), but is transmitted to the elastic body (10') and the second elastic layer (12') through elastic deformation of the second electrode (22).

In this way, in the second embodiment, unlike the electrode portion (20) in the first embodiment, it is formed with a structure of a first electrode (21), a via electrode (31), and a second electrode (22). In the first embodiment, the electrode portion (20) does not directly contact the second elastic layer (12'), whereas in the second embodiment, the via electrode (31) penetrates the second elastic layer (12') vertically and makes direct contact with it. Accordingly, the force applied to the via electrode (31) is directly transmitted to the second elastic layer (12'), making it easy for the second elastic layer (12') to absorb impact or load.

As in the first embodiment, the second elastic layer (12') may be configured in a shape in which the width increases from the upper side to the lower side. This allows the load applied from the upper side to be easily dispersed downward.

Also, similarly to the first embodiment, an isolation groove may be formed in the elastic body (10'). By forming the isolation groove, each probe pin (30') maintains a microscopic gap from the elastic body (10'), thereby reducing friction between the probe pin (30') and the elastic body (10').

As described above, the probe head according to the first and second embodiments of the present invention can effectively absorb shock or load generated during inspection, thereby preventing damage to the probe head or the device under test and improving inspection stability and reliability.

Furthermore, under thermal and chemical conditions, the invention can prevent the loss of elasticity due to deformation of the second elastic layer (12, 12') and corrosion of the electrode portion (20) or respective electrodes, thus enhancing quality and increasing durability.

Additionally, the deformation of the probe pin (30, 30') array formed on the elastic body (10, 10') can be minimized, and independent elastic behavior of each probe pin can improve inspection reliability.

Hereinafter, with reference to FIGS. 5 to 36, the methods of manufacturing the probe heads according to the embodiments of the present invention will be described.

The manufacturing method of the probe head according to the first embodiment will be described with reference to FIGS. 5 to 21, and the manufacturing method according to the second embodiment will be described with reference to FIGS. 22 to 36.

Figure 5:
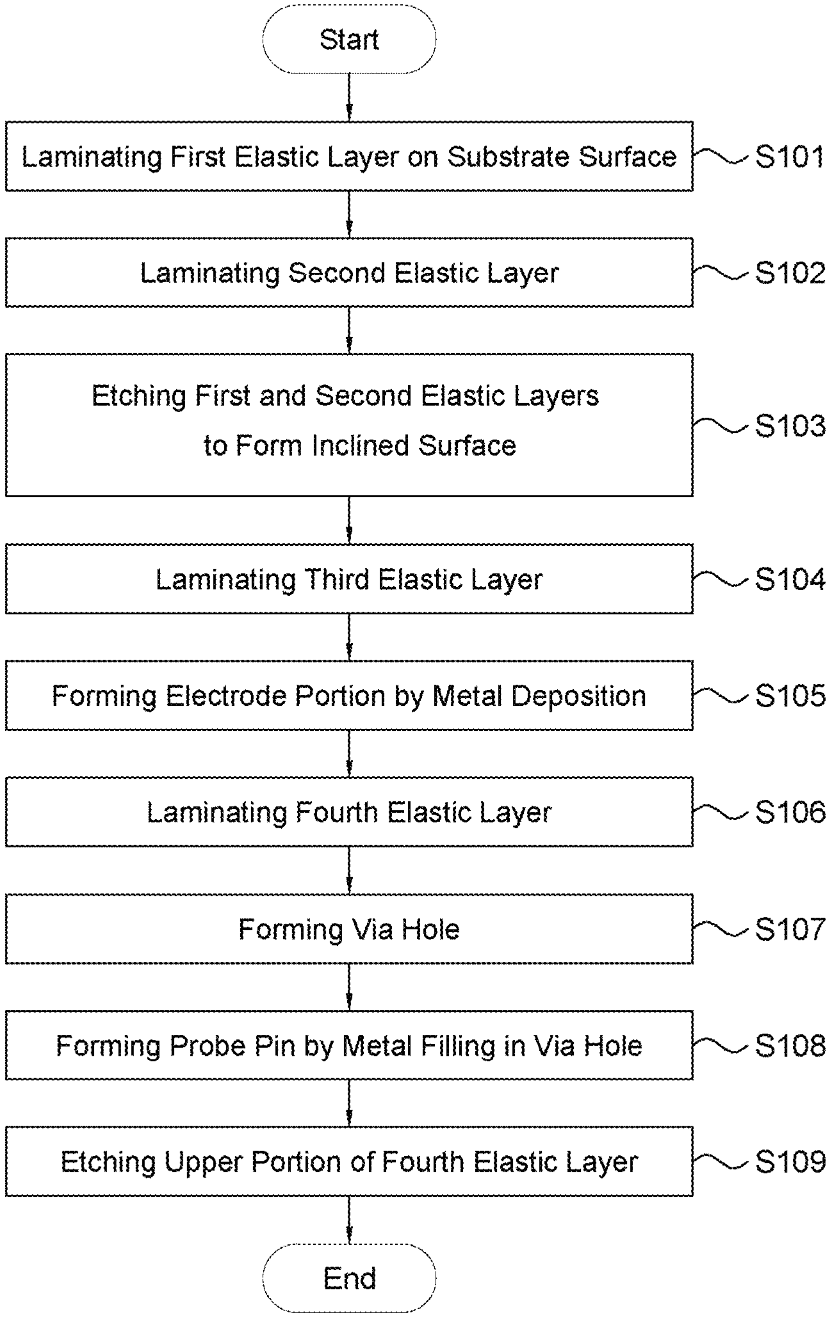
FIG. 5 is a flowchart illustrating a method for manufacturing a probe head according to the first embodiment of the present invention.

FIG. 5 is a flowchart illustrating the method of manufacturing the probe head according to the first embodiment. The method includes the following steps:

(S101) Laminating a first elastic layer (11) on the upper surface of a substrate;

(S102) Laminating a second elastic layer (12) on the upper surface of the first elastic layer (11);
(S103) Etching the first elastic layer (11) and the second elastic layer (12) to form an inclined surface;
(S104) Laminating a third elastic layer (13) on the substrate, the inclined surface, and the upper surface of the second elastic layer (12);
(S105) Forming an electrode portion (20) by depositing metal on the upper surface of the third elastic layer (13);
(S106) Laminating a fourth elastic layer (14) on the upper surface of the electrode portion (20);
(S107) Forming a hole mask on the upper surface of the fourth elastic layer (14) and etching down to the upper surface of the electrode portion (20) to form a via hole (H1);
(S108) Filling metal into the via hole (H1) to form a probe pin (30);
(S109) Etching the upper portion of the fourth elastic layer (14) to a predetermined thickness to expose the top of the probe pin (30).

Figure 6:
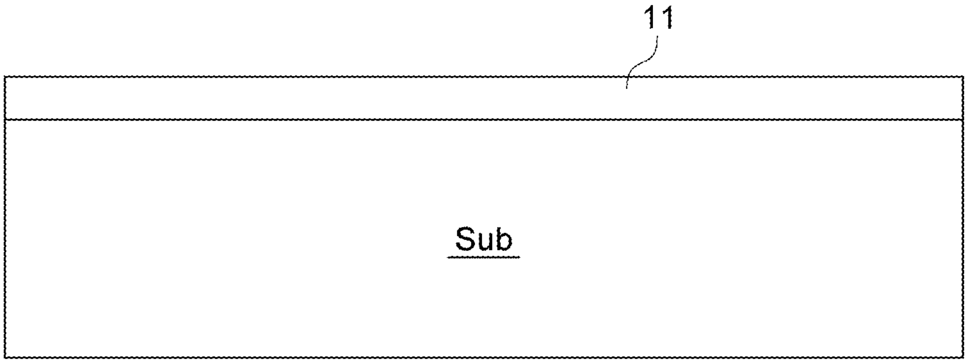
FIG. 6 illustrates a step of laminating a first elastic layer according to the first embodiment of the present invention.

FIG. 6 illustrates a step (S101) of laminating a first elastic layer (11) according to the first embodiment of the present invention. The first elastic layer (11) is a component configured to be combined with a third elastic layer (13) and a fourth elastic layer (14), which will be described later, to form an elastic body (10). Specifically, the first elastic layer (11) is laminated by coating a synthetic resin material on the upper surface of a substrate (Sub). Preferably, the first elastic layer (11) may be formed on the upper surface of the substrate (Sub) using a spin-coating method.

In addition, it is preferable that the first elastic layer (11), among the plurality of elastic layers to be described later, is formed of a material having the highest adhesive strength. Accordingly, the elastic body (10), formed by laminating the plurality of elastic layers, can be strongly bonded to the substrate (Sub), thereby improving the durability of the probe head.

Figure 7:
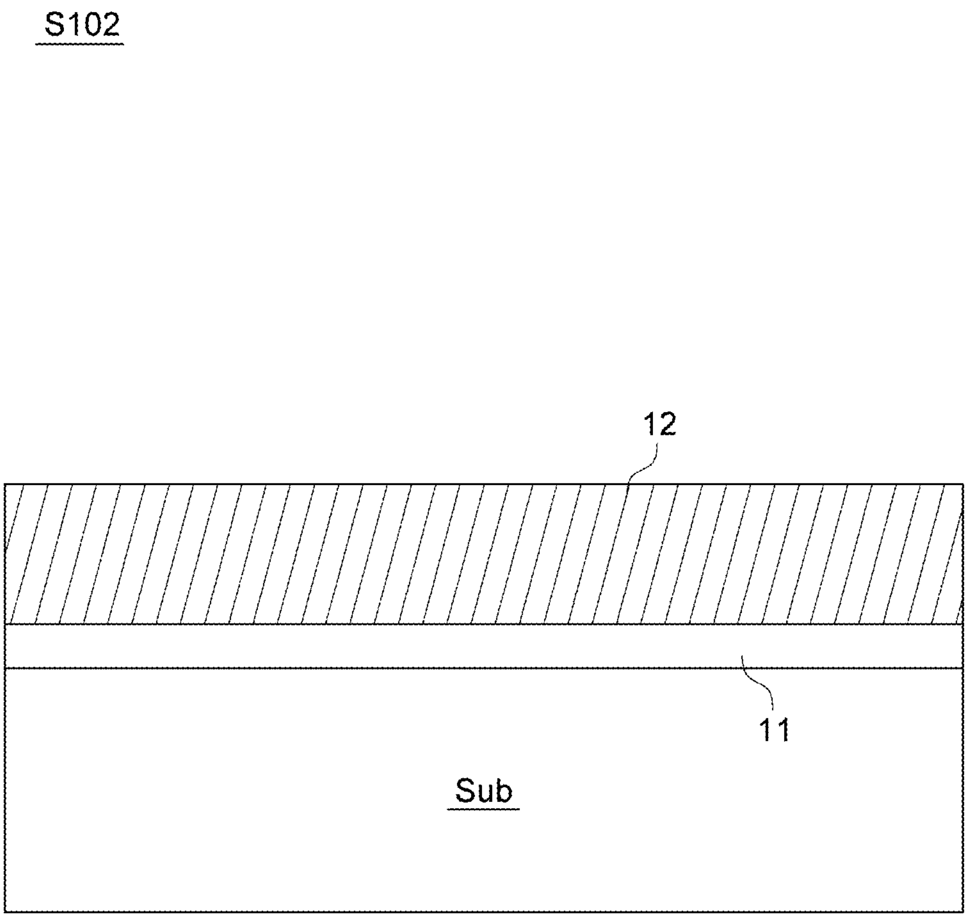
FIG. 7 illustrates a step of laminating a second elastic layer according to the first embodiment of the present invention.

FIG. 7 illustrates a step (S102) of laminating a second elastic layer (12) according to the first embodiment of the present invention. The second elastic layer (12) is laminated by coating a synthetic resin material on the upper surface of the first elastic layer (11).

Figure 8:
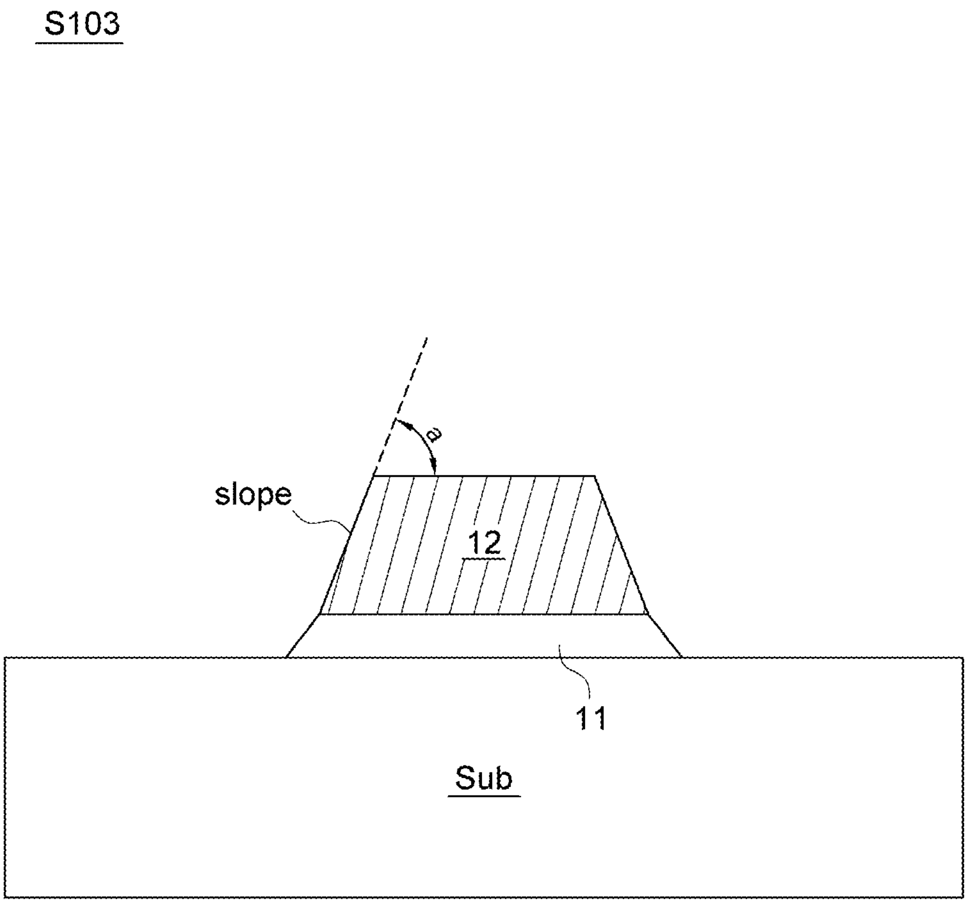
FIG. 8 illustrates a step of etching the first elastic layer and the second elastic layer according to the first embodiment of the present invention to form an inclined surface.

FIG. 8 illustrates a step (S103) of etching the first elastic layer (11) and the second elastic layer (12) according to the first embodiment of the present invention to form an inclined surface (slope). As described above, the second elastic layer (12) is provided in a shape in which the width increases from the upper side to the lower side. To achieve this, the first elastic layer (11) and the second elastic layer (12) are etched so that their side surfaces form an inclined shape.

Preferably, the internal angle (a) of the inclined surface (slope) may be formed to be 80° or less.

Figure 9:
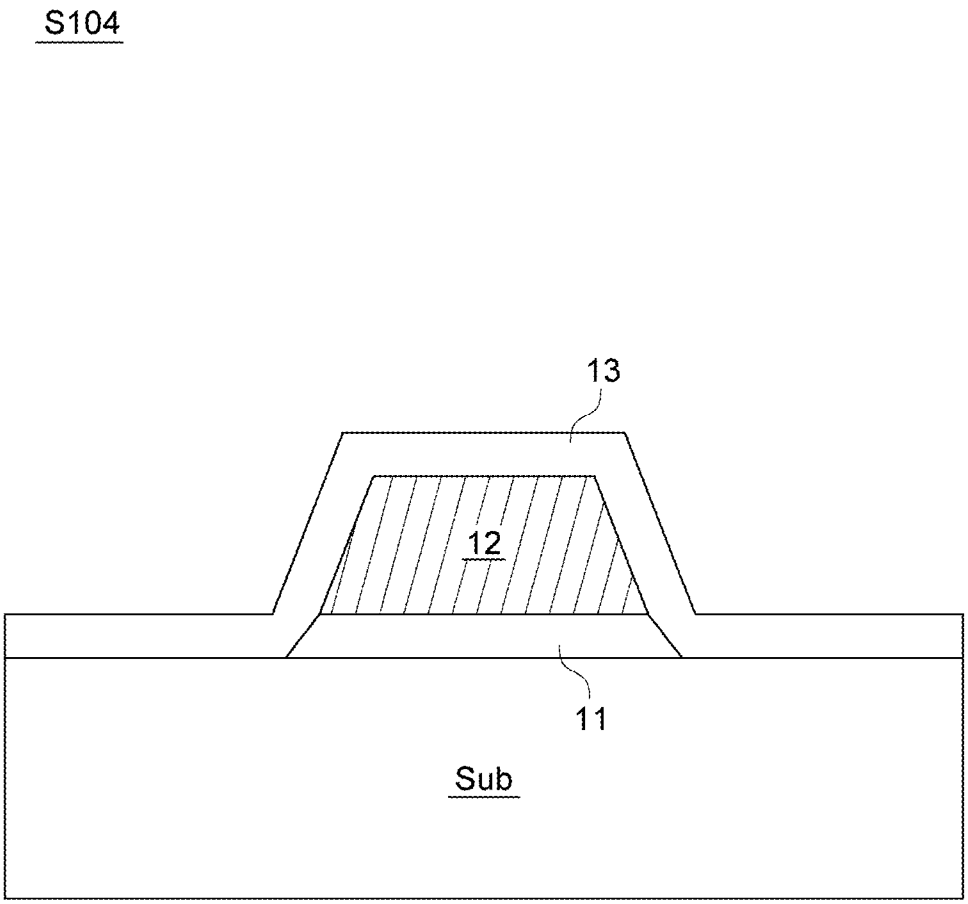
FIG. 9 illustrates a step of laminating a third elastic layer according to the first embodiment of the present invention.

FIG. 9 illustrates a step (S104) of laminating a third elastic layer (13) according to the first embodiment of the present invention. The third elastic layer (13) is a component configured to be combined with the above-described first elastic layer (11) and the later-described fourth elastic layer (14) to form an elastic body (10). Specifically, the third elastic layer (13) is laminated by coating a synthetic resin material to a predetermined thickness on the upper surface of the first elastic layer (11), the inclined surface, and the second elastic layer (12). By laminating the third elastic layer (13) with a uniform thickness, an inclination corresponding to the inclined surface is also formed in the third elastic layer (13).

The third elastic layer (13) may be formed of the same material as the first elastic layer (11). Alternatively, it may be formed of a different material from the first elastic layer (11), but with a lower coefficient of thermal expansion than that of the second elastic layer (12).

As the third elastic layer (13) is laminated, the second elastic layer (12) becomes embedded between the first elastic layer (11) and the third elastic layer (13).

Hereinafter, in the drawings, the first elastic layer (11) and the third elastic layer (13) are collectively denoted by the reference numeral of the elastic body (10).

Figure 10:
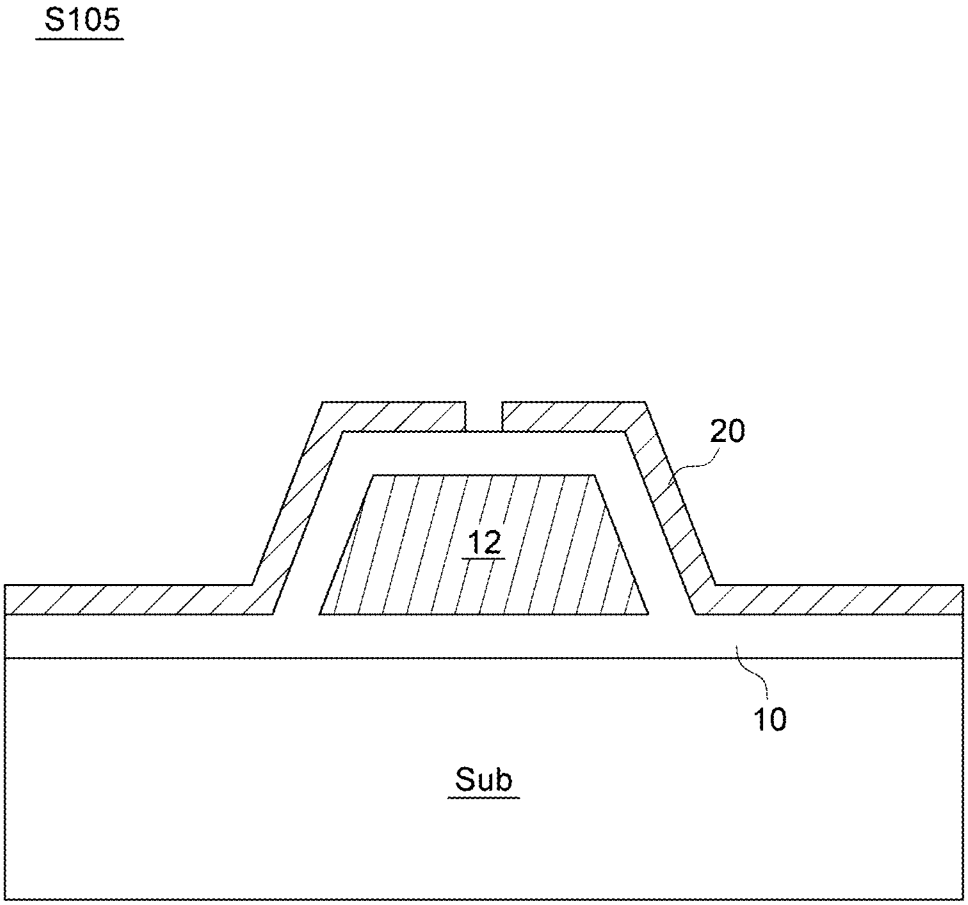
FIG. 10 illustrates a step of forming an electrode portion according to the first embodiment of the present invention.

FIG. 10 illustrates a step (S105) of forming an electrode portion (20) according to the first embodiment of the present invention. The electrode portion (20) is formed by depositing metal on the upper surface of the third elastic layer (13). More specifically, the electrode portion (20) is deposited on the upper surface of the first elastic layer (11), the inclined surface of the third elastic layer (13), and the upper surface of the third elastic layer (13). A known deposition technique, such as photolithography, may be used in consideration of spacing between a plurality of electrode portions (20). A detailed description thereof will be omitted in this specification.

Figure 11:
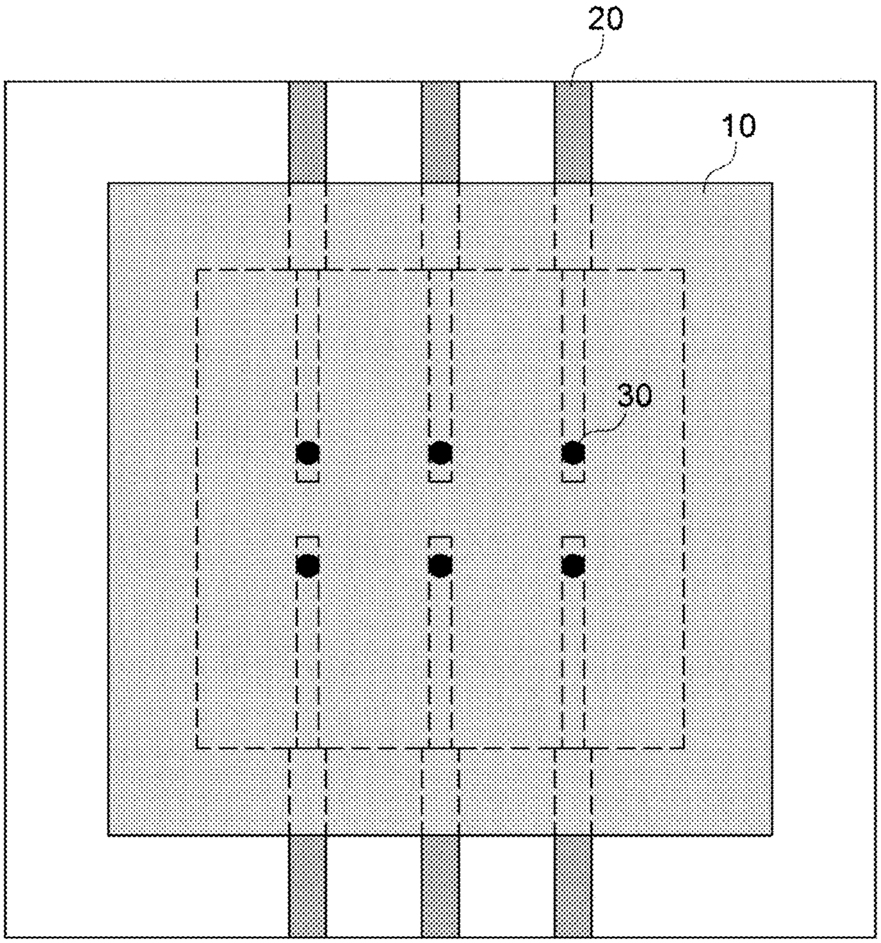
FIG. 11 illustrates a plan view of a probe head according to the first embodiment of the present invention.

FIG. 11 illustrates a plan view of a probe head according to the first embodiment of the present invention. Referring to FIG. 11, the planar shape of the electrode portion (20) may be modified according to the arrangement of each probe pin (30), and is not limited to any specific shape.

Figure 12:
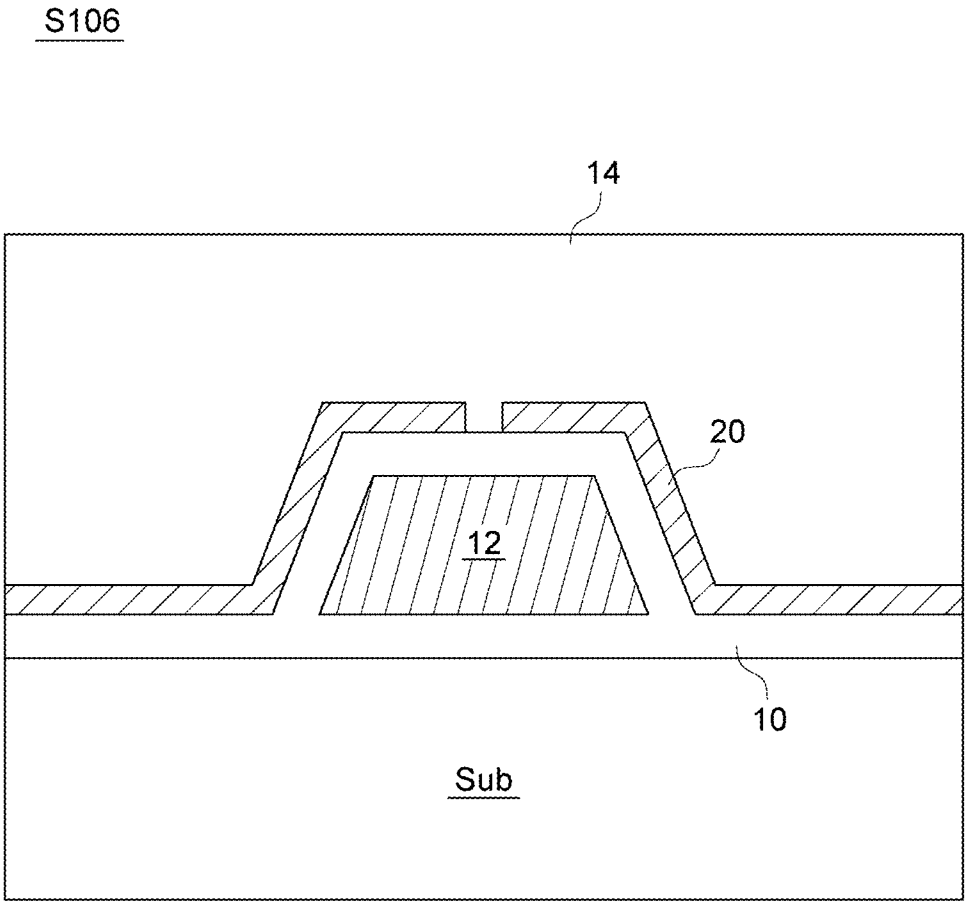
FIG. 12 illustrates a step of laminating a fourth elastic layer according to the first embodiment of the present invention.

FIG. 12 illustrates a step (S106) of laminating a fourth elastic layer (14) according to the first embodiment of the present invention. The fourth elastic layer (14) is a component configured to be combined with the above-described first elastic layer (11) and third elastic layer (13) to form an elastic body (10). Specifically, the fourth elastic layer (14) is laminated by coating a synthetic resin material to a predetermined thickness on the upper surface of the electrode portion (20) and the third elastic layer (13). However, the fourth elastic layer (14) is laminated such that its upper surface forms a flat plane. This may be achieved by repeatedly laminating multiple elastic layers.

The fourth elastic layer (14) may be formed of the same material as the first elastic layer (11) or the third elastic layer (13). Alternatively, it may be formed of a different material from the first elastic layer (11) and the third elastic layer (13), but with a lower coefficient of thermal expansion than that of the third elastic layer (13).

As the fourth elastic layer (14) is laminated, the electrode portion (20) becomes embedded between the third elastic layer (13) and the fourth elastic layer (14).

Hereinafter, in the drawings, the first elastic layer (11), the third elastic layer (13), and the fourth elastic layer (14) are collectively denoted by the reference numeral of the elastic body (10).

Figure 13:
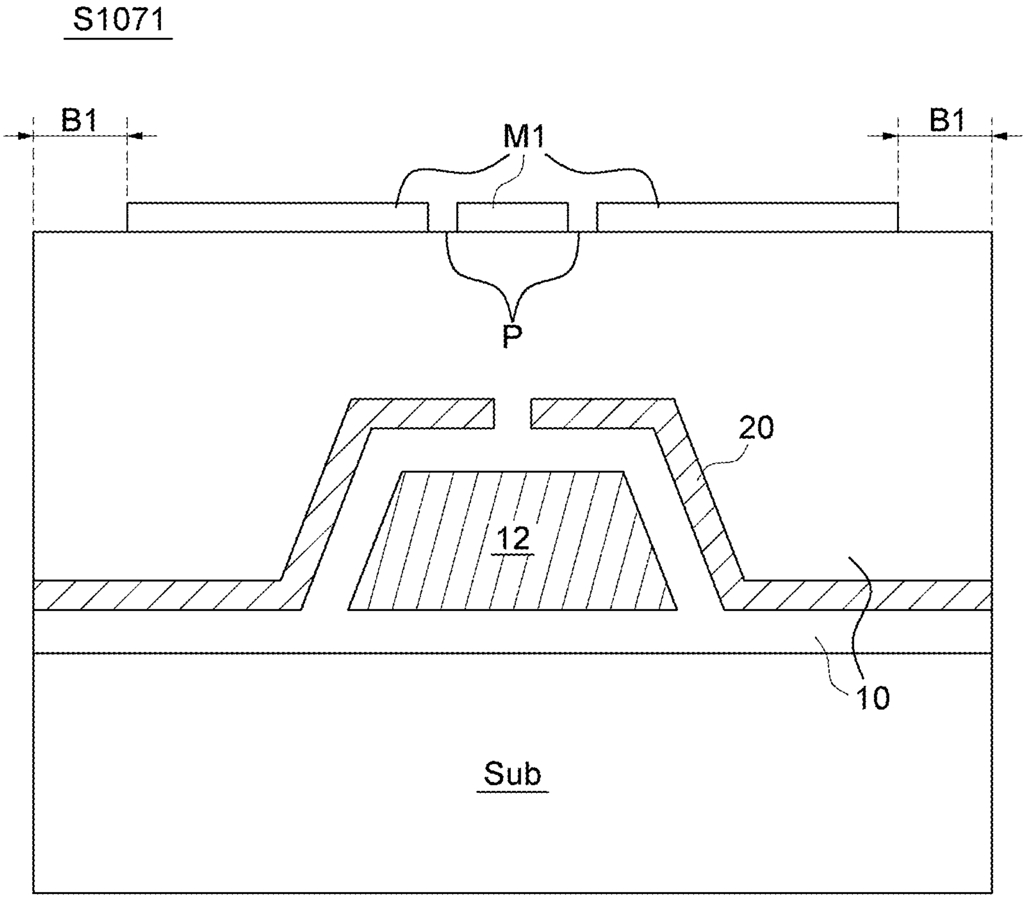
FIG. 13 illustrates a state in which a hole mask is formed during a step of forming a via hole according to the first embodiment of the present invention.

FIG. 13 illustrates a state (S1071) in which a hole mask is formed during a step (S107) of forming a via hole (H1) according to the first embodiment of the present invention. To form the via hole (H1), which will be described later, a hole mask is formed on the upper surface of the fourth elastic layer (14). Here, the via hole (H1) refers to a hole formed to vertically penetrate from the upper surface of the elastic body (10) to the upper surface of the electrode portion (20) at the location where the probe pin (30) is to be formed. The hole mask is formed to expose a position (P) on the upper surface of the fourth elastic layer (14) where the via hole (H1) is to be formed, while masking the remaining areas.

Additionally, it is preferable that the hole mask also exposes an edge region (B1) along the outer periphery of the fourth elastic layer (14). This is because the outer peripheral portion of the fourth elastic layer (14) must also be etched to expose one end of the electrode portion (20) at the side surface of the probe head.

Figure 14:
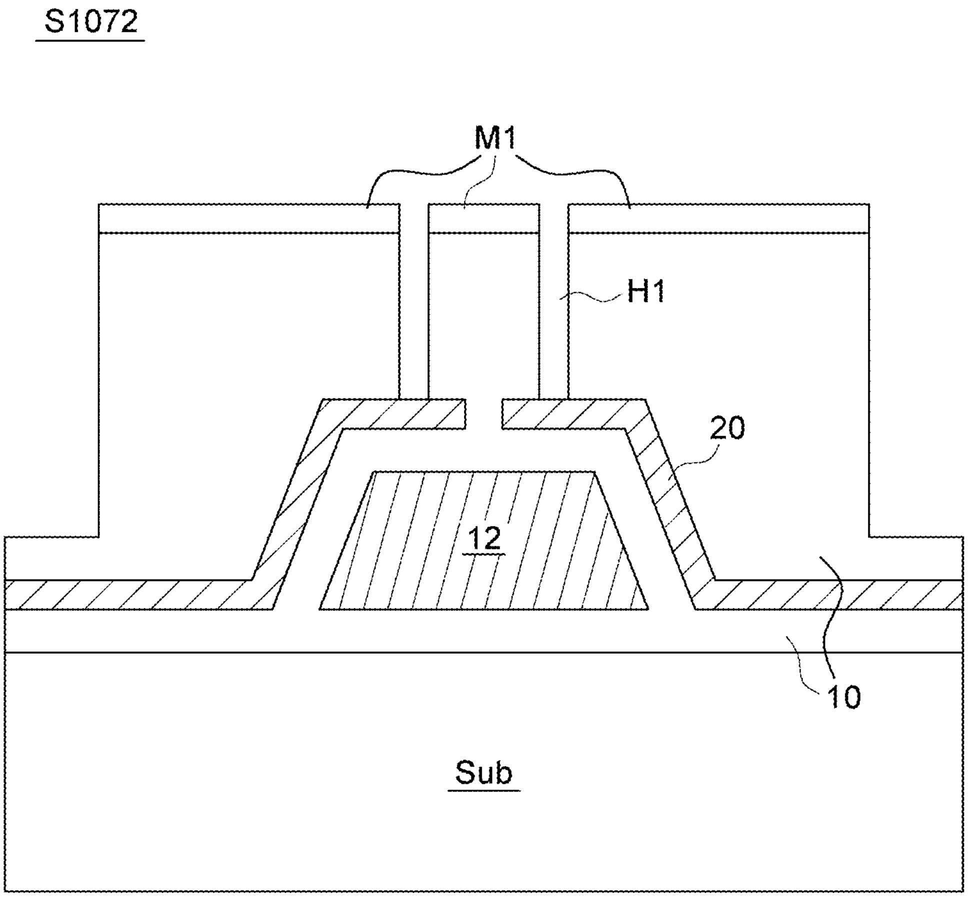
FIG. 14 illustrates the formation of a via hole according to the first embodiment of the present invention.

FIG. 14 illustrates a via hole (H1) formation step (S1072) according to the first embodiment of the present invention. The via hole (H1) is formed by etching through the hole mask. Here, the via hole (H1) is etched to a depth that exposes the upper surface of the electrode portion (20). At the same time, as shown in FIG. 14, it is preferable that the edge region of the fourth elastic layer (14) is also etched, leaving only a predetermined thickness.

Figure 15:
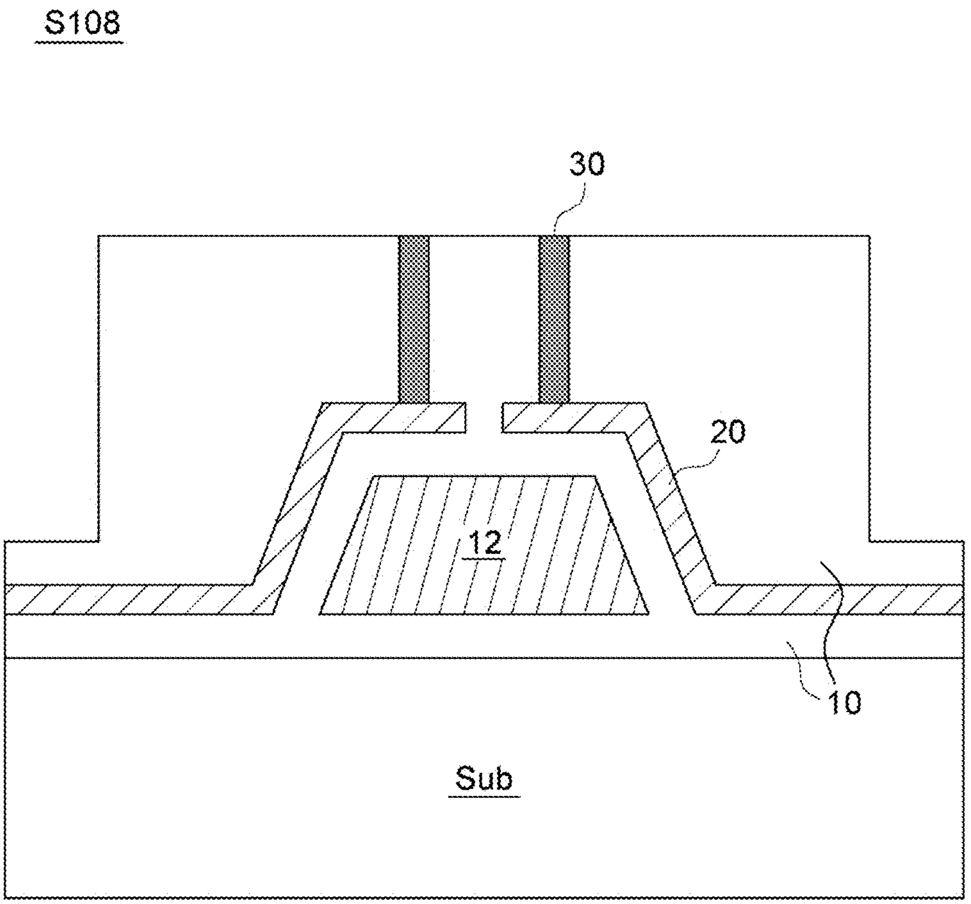
FIG. 15 illustrates a step of forming a probe pin according to the first embodiment of the present invention.

FIG. 15 illustrates a step (S108) of forming a probe pin (30) according to the first embodiment of the present invention. The probe pin (30) is formed by filling metal into the via hole (H1).

Figure 16:
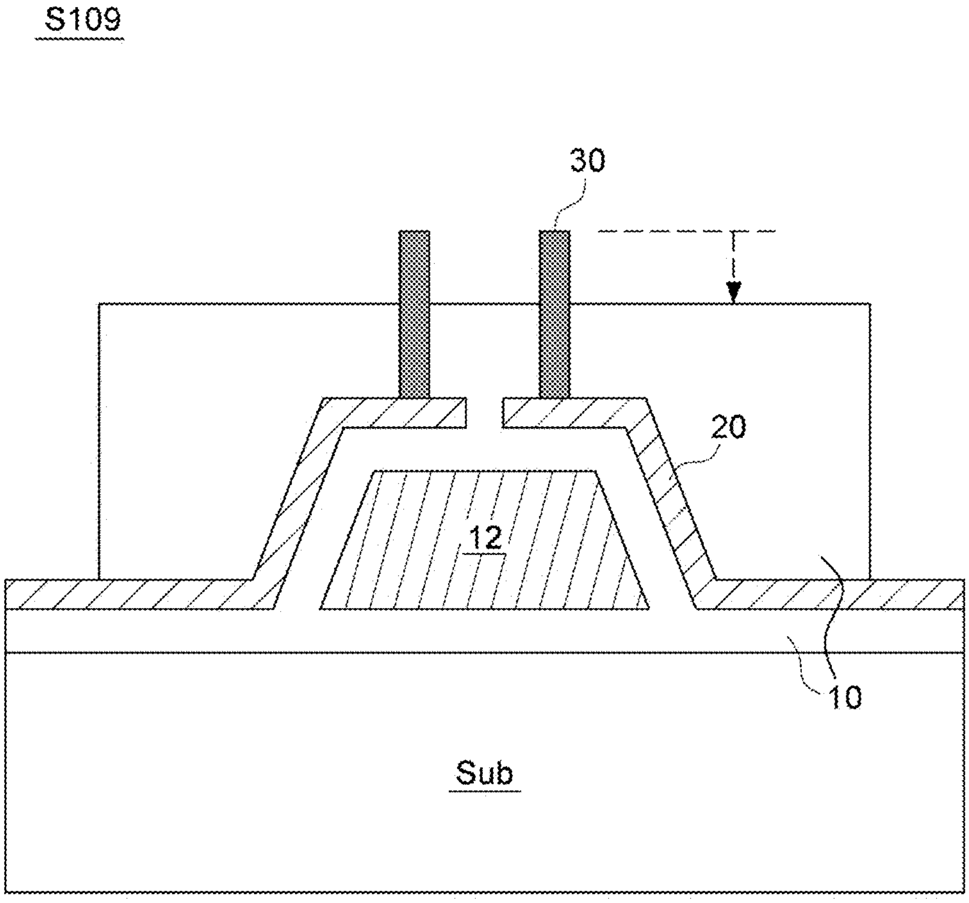
FIG. 16 illustrates a step of protruding an upper portion of a probe pin according to the first embodiment of the present invention.

FIG. 16 illustrates a step (S109) of protruding an upper portion of the probe pin (30) according to the first embodiment of the present invention. The upper portion of the fourth elastic layer (14) is etched to a predetermined thickness to protrude the upper portion of the probe pin (30). At the same time, the edge region of the fourth elastic layer (14) is also etched, thereby exposing one end of the electrode portion (20) at the side surface of the probe head.

Figure 17:
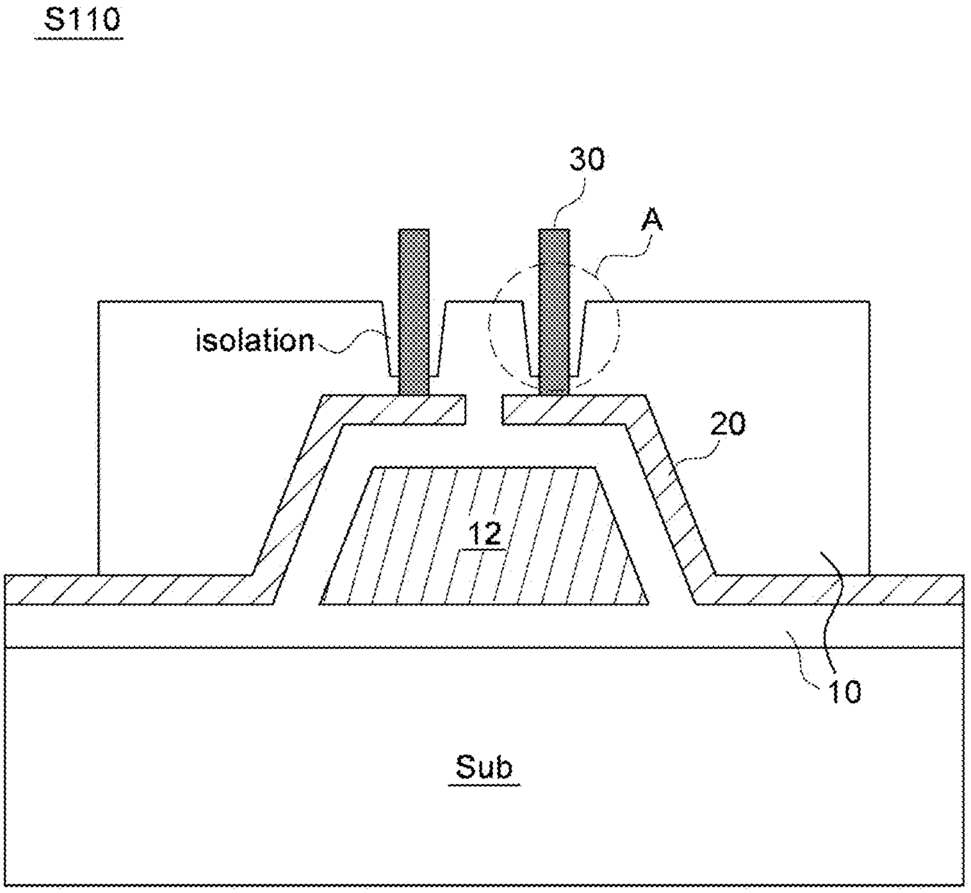
FIG. 17 illustrates a step of forming a groove according to the first embodiment of the present invention.
Figure 18:
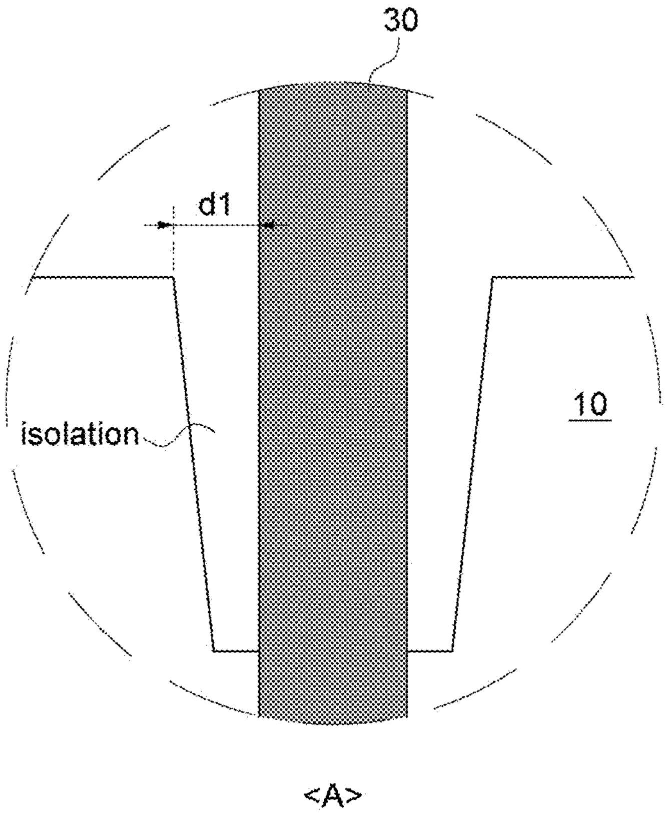
FIG. 18 is an enlarged view of a part (A) of FIG. 17.

FIG. 17 illustrates a step (S110) of forming a groove portion (isolation) according to the first embodiment of the present invention, and FIG. 18 is an enlarged view of a part (A) of FIG. 17.

As described above, a groove portion (isolation) may be formed as a preferred embodiment of the present invention. The groove portion (isolation) is formed after the step of protruding the upper portion of the probe pin (30), by etching the fourth elastic layer (14) within a predetermined width (d1 in FIG. 18) from the outer peripheral surface of the probe pin (30), such that a part of the outer peripheral surface of the probe pin (30) is spaced apart from the fourth elastic layer (14).

Preferably, the groove portion (isolation) may be formed by wet etching through high-temperature plasma treatment of the elastic body (10), followed by the use of NMP (N-methyl-2-pyrrolidinone), a mixture of NMP and TBAF (Tetrabutylammonium fluoride), or a hydrofluoric acid-based solution.

Figure 19:
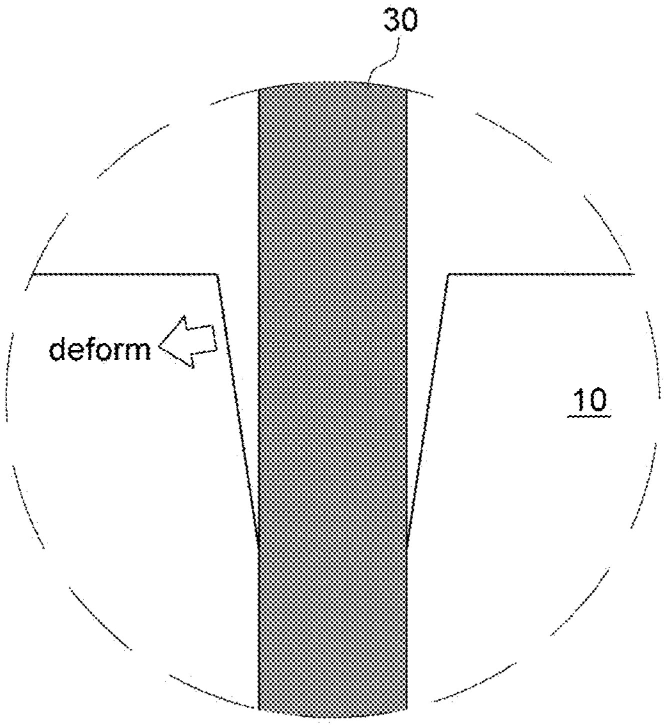
FIG. 19 illustrates a high-temperature plasma treatment step.

FIG. 19 illustrates a high-temperature plasma treatment step. When the upper surface of the fourth elastic layer (14) undergoes high-temperature plasma treatment, the edge portion adjacent to the probe pin (30) becomes deformed, creating a gap between the fourth elastic layer (14) and the outer peripheral surface of the probe pin (30).

Figure 20:
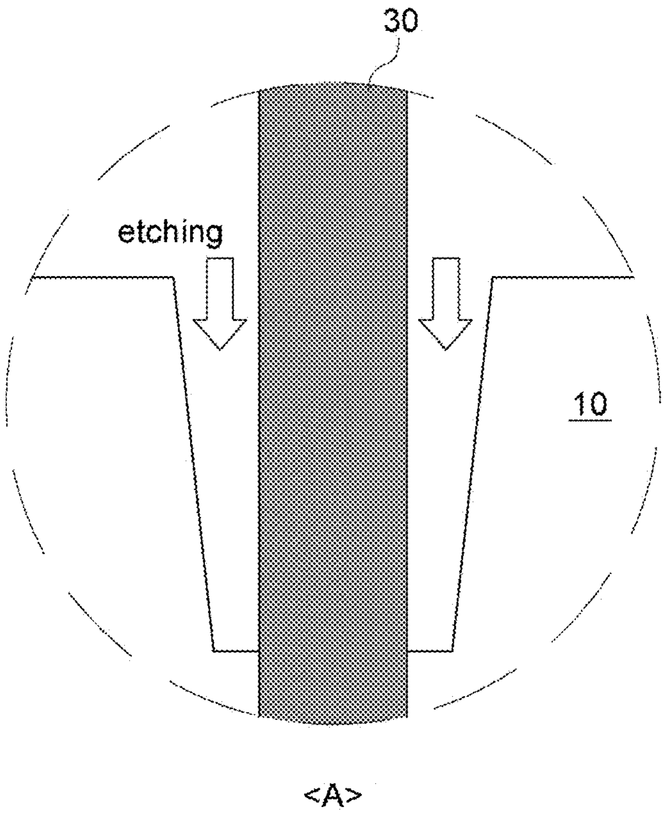
FIG. 20 illustrates a wet etching treatment step.

FIG. 20 illustrates a wet etching treatment step. The gap created during the high-temperature plasma treatment step is further widened through wet etching. Through this process, the groove portion (isolation) is formed.

Figure 21:
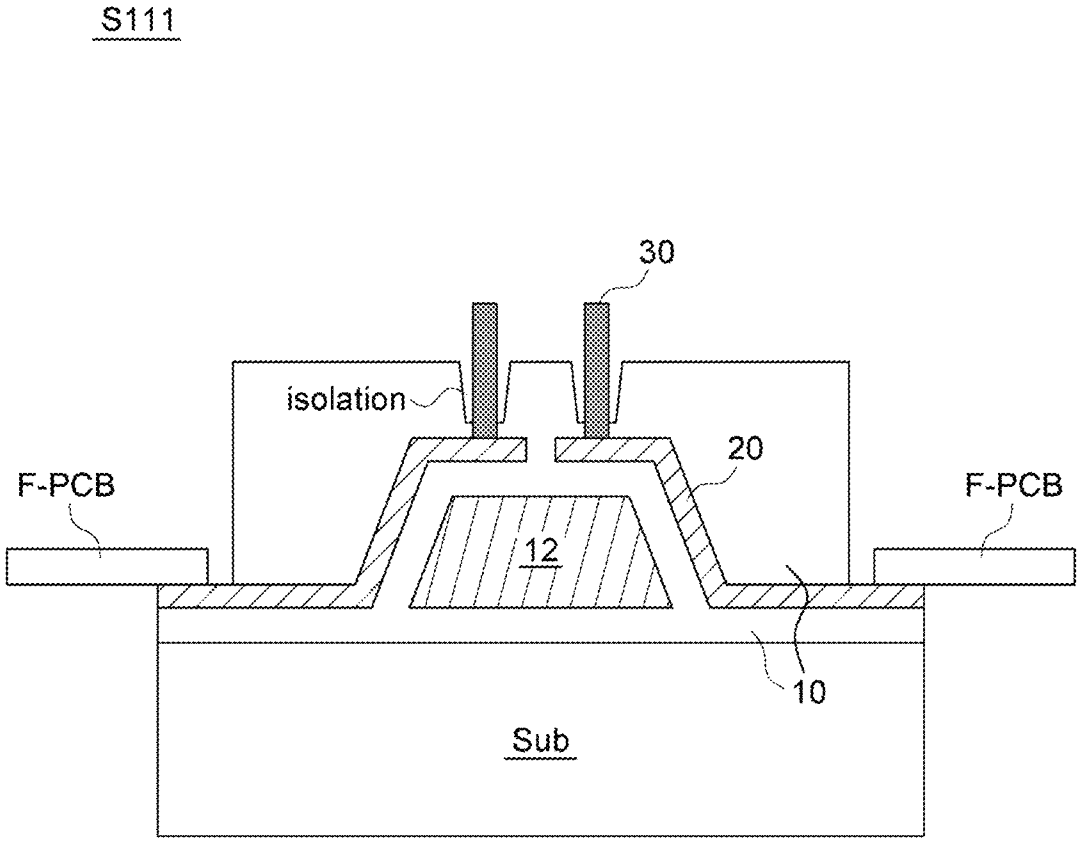
FIG. 21 illustrates a step of connecting a flexible printed circuit board to an electrode portion.

FIG. 21 illustrates a step (S111) of connecting a flexible printed circuit board (F-PCB) to the electrode portion (20).

Finally, by connecting the flexible printed circuit board (F-PCB) to the exposed portion of the electrode portion (20), the fabrication of the probe head according to the first embodiment of the present invention is completed.

Hereinafter, with reference to FIGS. 22 to 36, a method for manufacturing a probe head according to the second embodiment of the present invention will be described.

A probe head according to the second embodiment of the present invention may be manufactured through the following steps:

(S201) Depositing a first electrode (21) on the upper surface of a substrate;

(S202) Laminating a first elastic layer (11') on the upper surface of the first electrode (21);

(S203) Laminating a second elastic layer (12') on the upper surface of the first elastic layer (11');

(S204) Etching the first elastic layer (11') and the second elastic layer (12) to form an inclined surface (slope);

(S205) Laminating a third elastic layer (13') on the substrate, the inclined surface (slope), and the upper surface of the second elastic layer (12');

(S206) Forming a first via mask (M1') that masks portions of the upper surface of the third elastic layer (13), excluding the location of the first via hole (H1') and the border portion;

(S207) Etching the third elastic layer (13') through the first via mask (M1') to form a first via hole (H1') that vertically penetrates from the first electrode (21) to the upper surface of the third elastic layer (13'), and exposing the border portion of the first electrode (21);

(S208) Filling metal into the first via hole (H1') to form a via electrode (31).

(S209) Depositing a second electrode (22) on the upper surface of the via electrode (31) and the third elastic layer (13');

(S210) Laminating a fourth elastic layer (14') on the upper surface of the third elastic layer (13') and the second electrode (22);

(S211) Forming a second via mask (M2') that masks portions of the upper surface of the fourth elastic layer (14'), excluding the location of the second via hole (H2') and the border portion;

(S212) Etching the fourth elastic layer (14') through the second via mask (M2') to form a second via hole (H2') that vertically penetrates from the second electrode (22) to the upper surface of the fourth elastic layer (14');

(S213) Filling metal into the second via hole (H2') to form a probe pin (30');

(S214) Etching the upper portion of the fourth elastic layer (14') to a predetermined thickness to protrude the upper portion of the probe pin (30') and the border portion of the first electrode (21).

Figure 22:
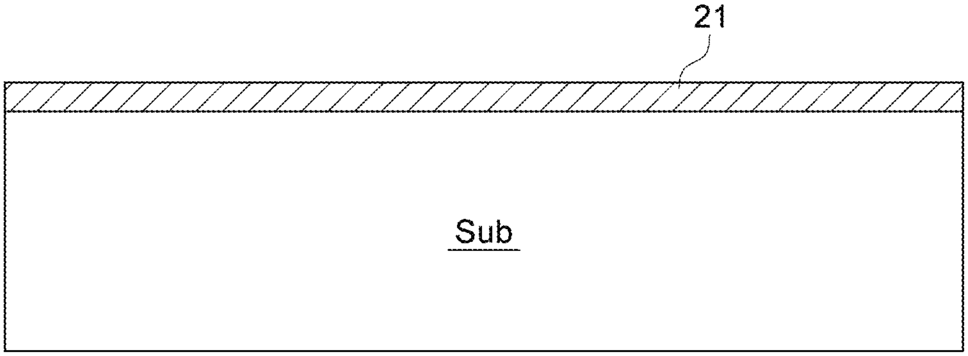
FIG. 22 illustrates a step of depositing a first electrode according to the second embodiment of the present invention.

FIG. 22 illustrates a step (S201) of depositing a first electrode (21) according to the second embodiment of the present invention. The first electrode (21) is formed by depositing metal to a predetermined thickness on the upper surface of the substrate.

FIG. 22 is a simplified vertical cross-sectional view in which the first electrode (21) is illustrated as covering the entire upper surface of the substrate. However, it is not limited thereto and may be modified into various shapes in consideration of the arrangement of the probe pins (30'). In addition, the planar shape of the first electrode (21) may also be modified based on the arrangement of the respective probe pins (30') and is not limited to any specific shape.

Figure 23:
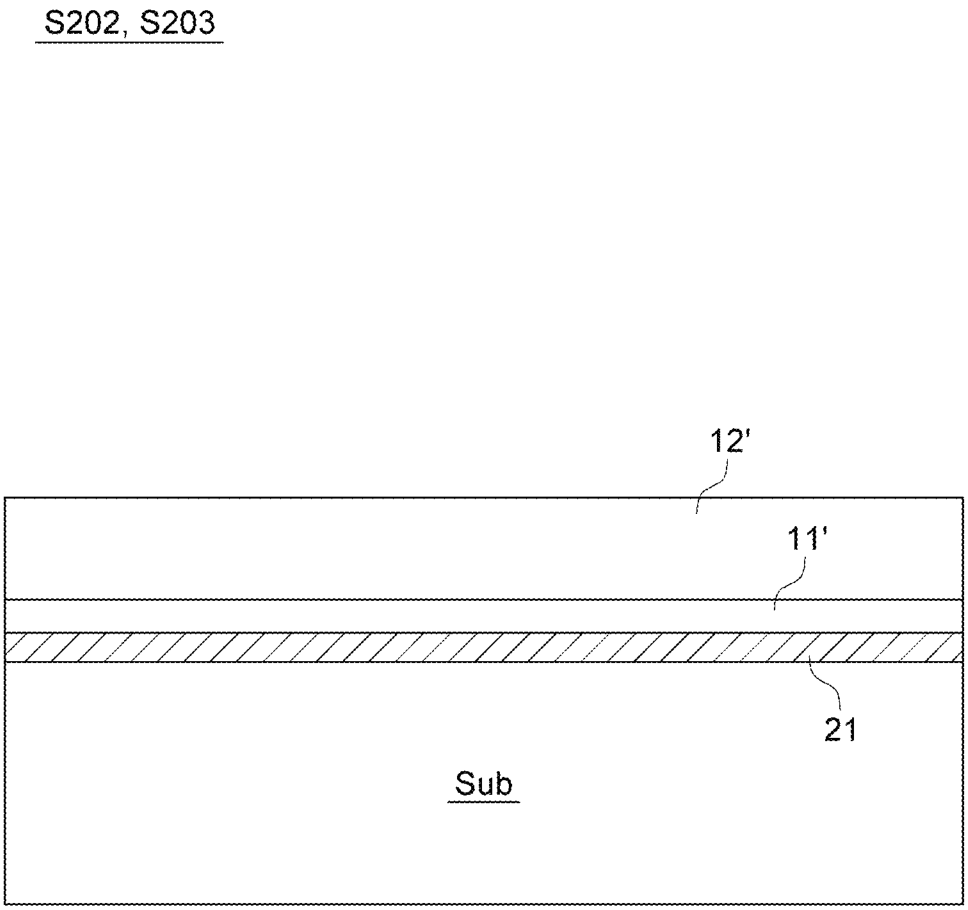
FIG. 23 illustrates a step of laminating a first elastic layer and a step of laminating a second elastic layer according to the second embodiment of the present invention.

FIG. 23 illustrates a step (S202) of laminating a first elastic layer (11') and a step (S203) of laminating a second elastic layer (12') according to the second embodiment of the present invention.

The first elastic layer (11') is a component configured to be combined with a third elastic layer (13') and a fourth elastic layer (14'), which will be described later, to form an elastic body (10'). Specifically, the first elastic layer (11') is laminated by coating a synthetic resin material on the upper surface of the substrate. Preferably, the first elastic layer (11') may be formed on the upper surface of the substrate (Sub) using a spin-coating method.

In addition, it is preferable that the first elastic layer (11'), among the plurality of elastic layers to be described later, is formed of a material having the highest adhesive strength. Accordingly, the elastic body (10'), formed by laminating the plurality of elastic layers, can be strongly bonded to the substrate, thereby improving the durability of the probe head.

After the first elastic layer (11') is laminated, the second elastic layer (12') is laminated by coating a synthetic resin material on the upper surface of the first elastic layer (11').

Figure 24:
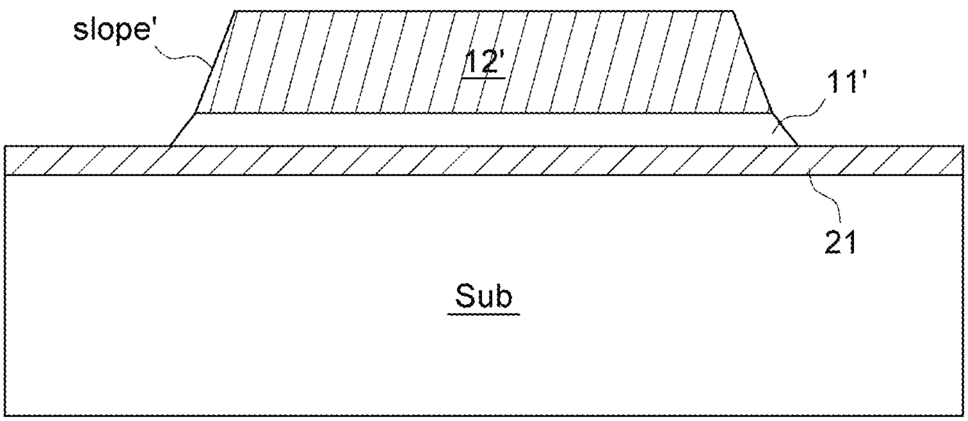
FIG. 24 illustrates a step of etching the first elastic layer and the second elastic layer to form an inclined surface according to the second embodiment of the present invention.

FIG. 24 illustrates a step (S204) of etching the first elastic layer (11') and the second elastic layer (12') to form an inclined surface according to the second embodiment of the present invention. As described above, the second elastic layer (12') is provided in a shape in which the width increases from the upper side to the lower side. To achieve this, the first elastic layer (11') and the second elastic layer (12') are etched so that their side surfaces form an inclined shape.

Preferably, the internal angle of the inclined surface (slope') may be formed to be 80° or less.

Figure 25:
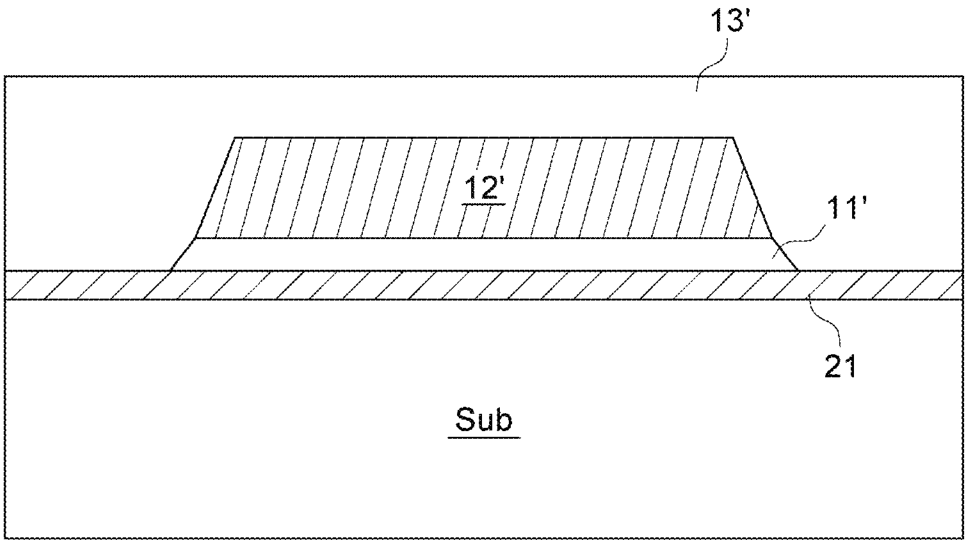
FIG. 25 illustrates a step of laminating a third elastic layer according to the second embodiment of the present invention.

FIG. 25 illustrates a step (S205) of laminating a third elastic layer (13') according to the second embodiment of the present invention. The third elastic layer (13') is a component configured to be combined with the above-described first elastic layer (11') and the later-described fourth elastic layer (14') to form an elastic body (10'). Specifically, the third elastic layer (13') is laminated by coating a synthetic resin material on the upper surface of the first elastic layer (11'), the inclined surface, and the second elastic layer (12').

The third elastic layer (13') may be formed of the same material as the first elastic layer (11'). Alternatively, it may be formed of a different material from the first elastic layer (11'), but with a lower coefficient of thermal expansion than that of the second elastic layer (12').

As the third elastic layer (13') is laminated, the second elastic layer (12') becomes embedded between the first elastic layer (11') and the third elastic layer (13').

Hereinafter, in the drawings, the first elastic layer (11') and the third elastic layer (13') are collectively denoted by the reference numeral of the elastic body (10').

Figure 26:
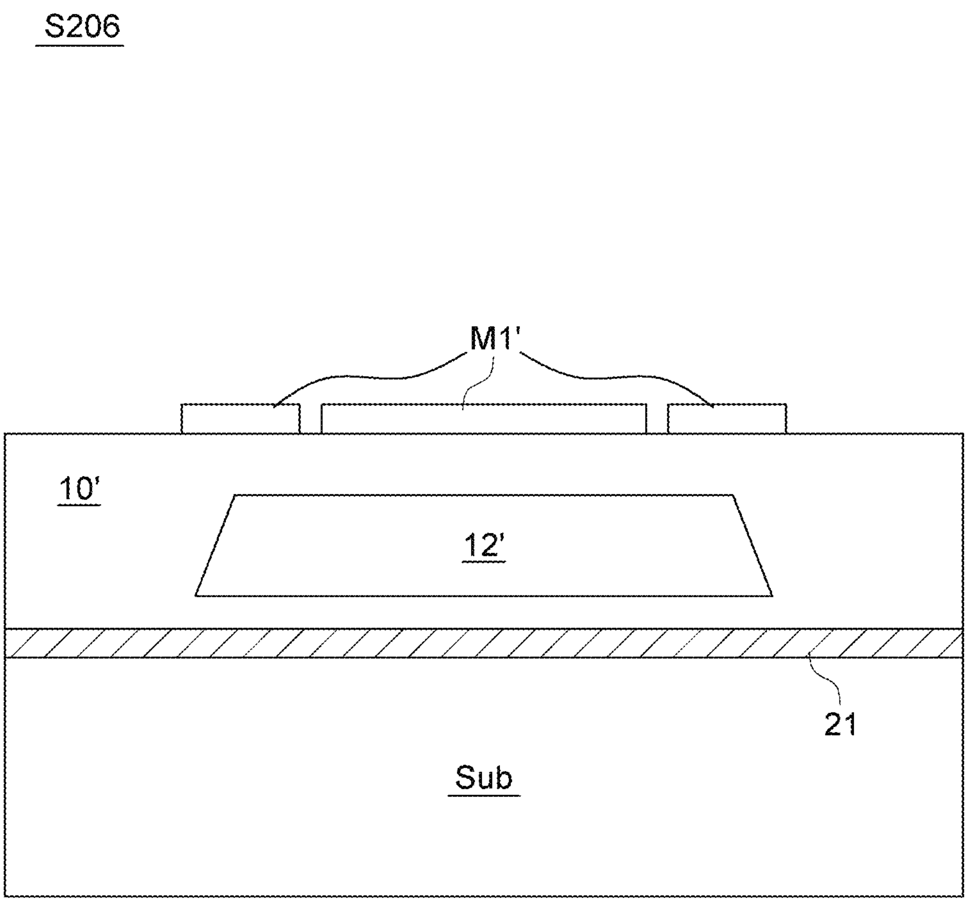
FIG. 26 illustrates a step of forming a first via mask according to the second embodiment of the present invention.

FIG. 26 illustrates a step (S206) of forming a first via mask (M1') according to the second embodiment of the present invention. To form a first via hole (H1'), which will be described later, a first via mask (M1') is formed on the upper surface of the third elastic layer (13'). Here, the first via hole (H1') refers to a hole formed to vertically penetrate from the upper surface of the third elastic layer (13') to the upper surface of the first electrode (21), at the location where the via electrode (31) is to be formed. The first via mask (M1') is formed to expose the location on the upper surface of the third elastic layer (13') where the first via hole (H1') is to be formed, while masking the remaining areas.

Additionally, it is preferable that the first via mask (M1') also exposes the edge region of the outer periphery of the third elastic layer (13'). This is because the outer peripheral portion of the third elastic layer (13') must also be etched in order to expose one end of the first electrode (21) at the side surface of the probe head.

Figure 27:
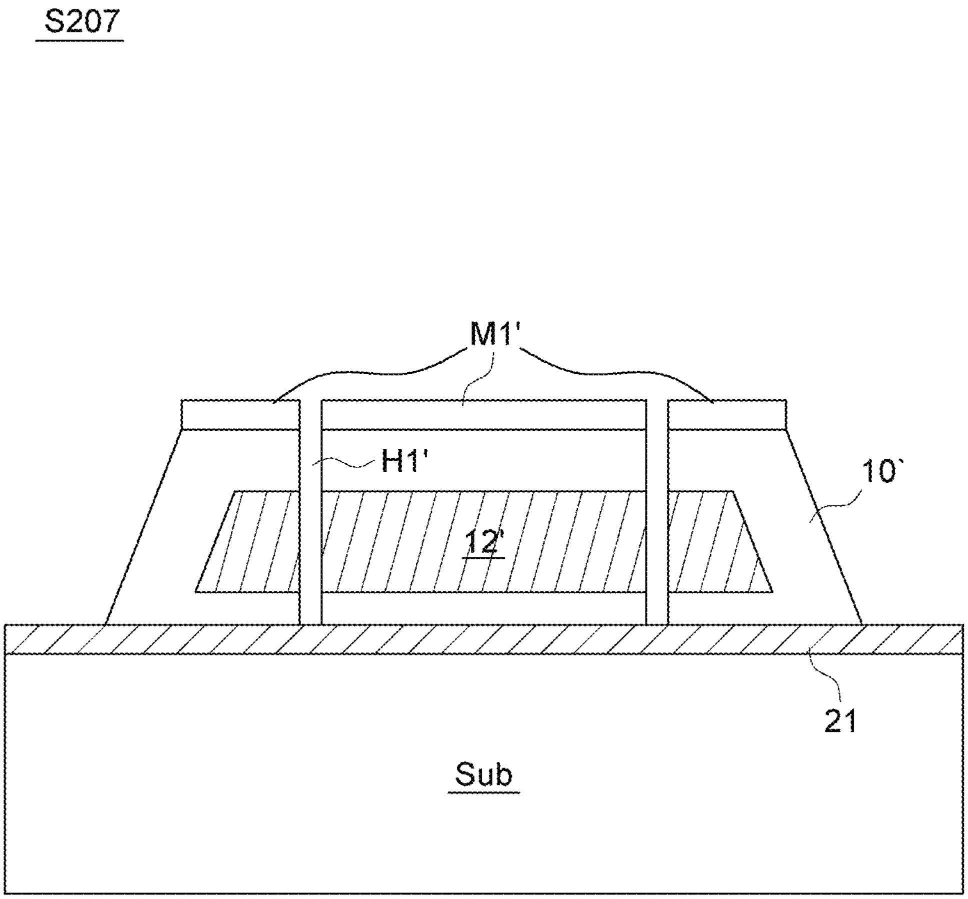
FIG. 27 illustrates a step of forming a first via hole and exposing a border portion of a first electrode according to the second embodiment of the present invention.

FIG. 27 illustrates a step (S207) of forming the first via hole (H1') and exposing the border portion of the first electrode (21) according to the second embodiment of the present invention. The first via hole (H1') is formed by etching through the first via mask (M1'). The first via hole (H1') is etched to a depth that exposes the upper surface of the first electrode (21). At the same time, as shown in FIG. 27, the edge region of the third elastic layer (13') is also etched, preferably forming an inclined surface that surrounds the second elastic layer (12').

Figure 28:
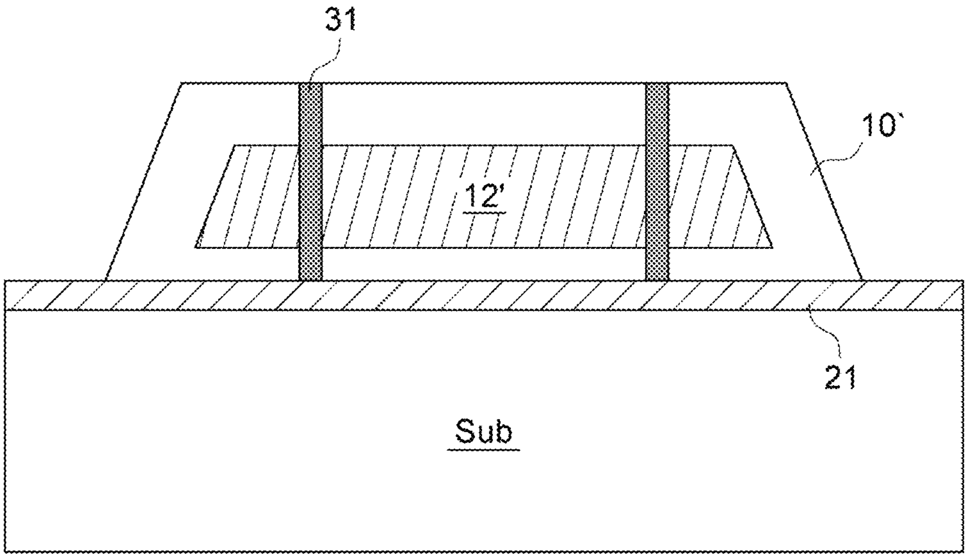
FIG. 28 illustrates a step of forming a via electrode according to the second embodiment of the present invention.

FIG. 28 illustrates a step (S208) of forming a via electrode (31) according to the second embodiment of the present invention. The via electrode (31) is formed by filling metal into the first via hole (H1').

Figure 29:
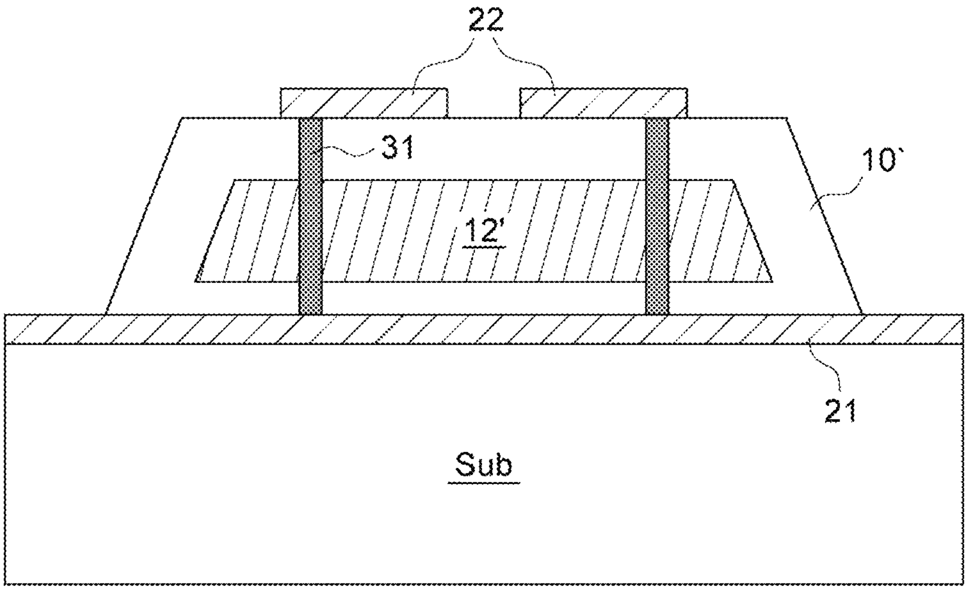
FIG. 29 illustrates a step of depositing a second electrode according to the second embodiment of the present invention.

FIG. 29 illustrates a step (S209) of depositing a second electrode (22) according to the second embodiment of the present invention. As described above, one end of the second electrode (22) is formed at a position connected to the via electrode (31), and the other end is formed at a position connected to the probe pin (30').

Figure 30:
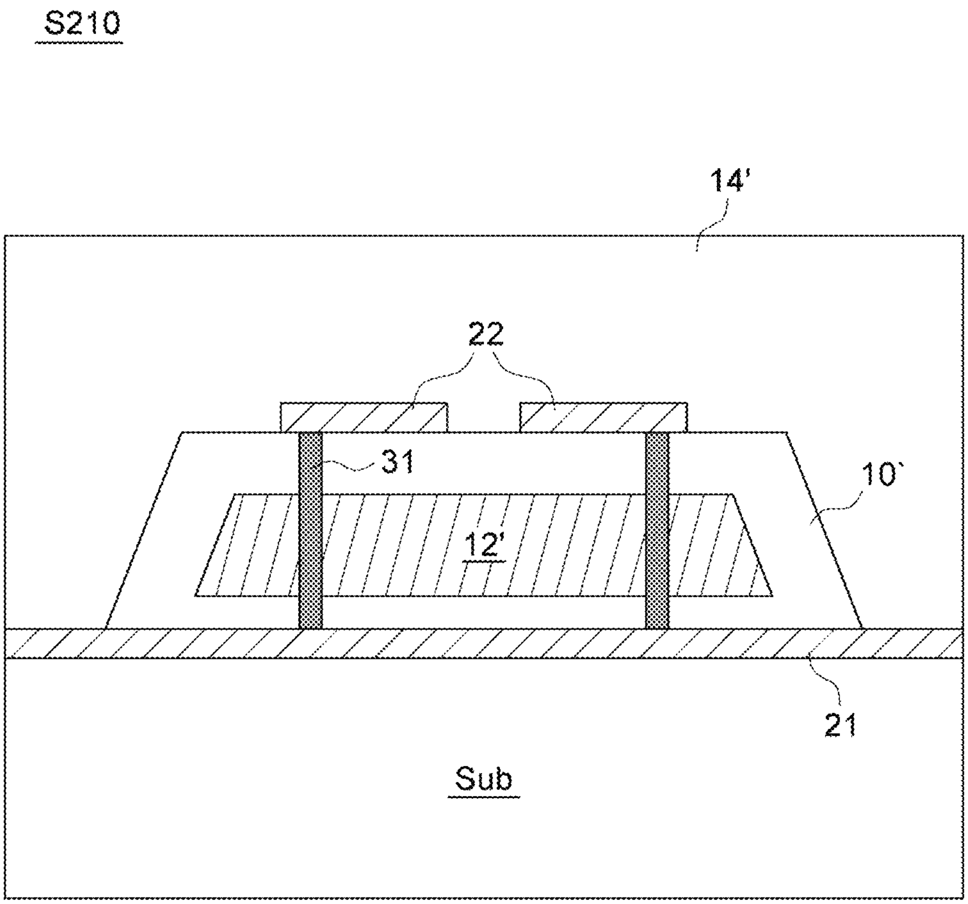
FIG. 30 illustrates a step of laminating a fourth elastic layer according to the second embodiment of the present invention.

FIG. 30 illustrates a step (S210) of laminating a fourth elastic layer (14') according to the second embodiment of the present invention. The fourth elastic layer (14') is a component configured to be combined with the first elastic layer (11') and the third elastic layer (13') to form an elastic body (10'). Specifically, the fourth elastic layer (14') is laminated by coating a synthetic resin material to a predetermined thickness on the upper surfaces of both ends of the first electrode (21), the second electrode (22), and the third elastic layer (13'). The fourth elastic layer (14') is laminated so that its upper surface forms a flat plane, which may be achieved by repeatedly laminating multiple elastic layers.

The fourth elastic layer (14') may be formed of the same material as the first elastic layer (11') or the third elastic layer (13'). Alternatively, it may be formed of a different material from the first and third elastic layers, but with a lower coefficient of thermal expansion than that of the third elastic layer (13').

As the fourth elastic layer (14') is laminated, the second electrode (22) becomes embedded between the third elastic layer (13') and the fourth elastic layer (14').

Hereinafter, in the drawings, the first elastic layer (11'), the third elastic layer (13'), and the fourth elastic layer (14') are collectively denoted by the reference numeral of the elastic body (10').

Figure 31:
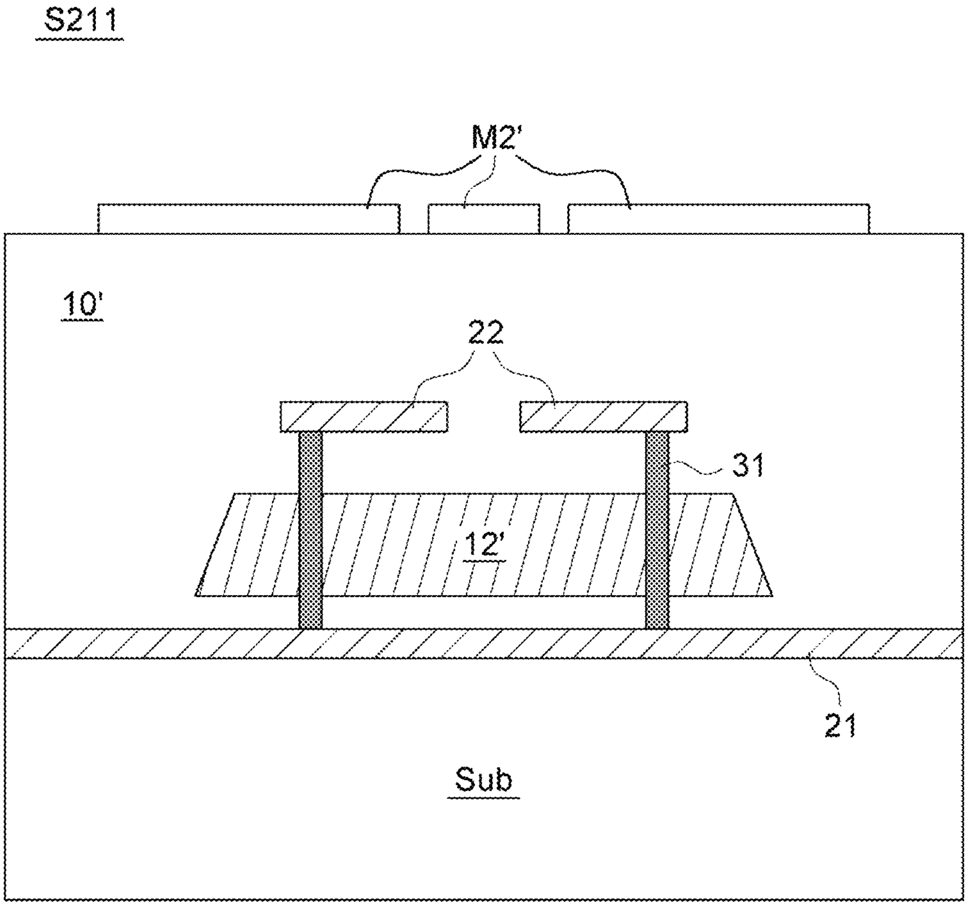
FIG. 31 illustrates a step of forming a second via mask according to the second embodiment of the present invention.

FIG. 31 illustrates a step (S211) of forming a second via mask (M2') according to the second embodiment of the present invention. To form a second via hole (H2'), which will be described later, the second via mask (M2') is formed on the upper surface of the fourth elastic layer (14'). Here, the second via hole (H2') refers to a hole formed to vertically penetrate from the upper surface of the fourth elastic layer (14') to the upper surface of the second electrode (22), at the location where the probe pin (30') is to be formed. The second via mask (M2') is formed to expose the location on the upper surface of the fourth elastic layer (14') where the second via hole (H2') is to be formed, while masking the remaining areas.

Additionally, it is preferable that the second via mask (M2') also exposes the edge region of the outer periphery of the fourth elastic layer (14'). This is because the outer peripheral portion of the fourth elastic layer (14') must also be etched in order to expose one end of the first electrode (21) at the side surface of the probe head.

Figure 32:
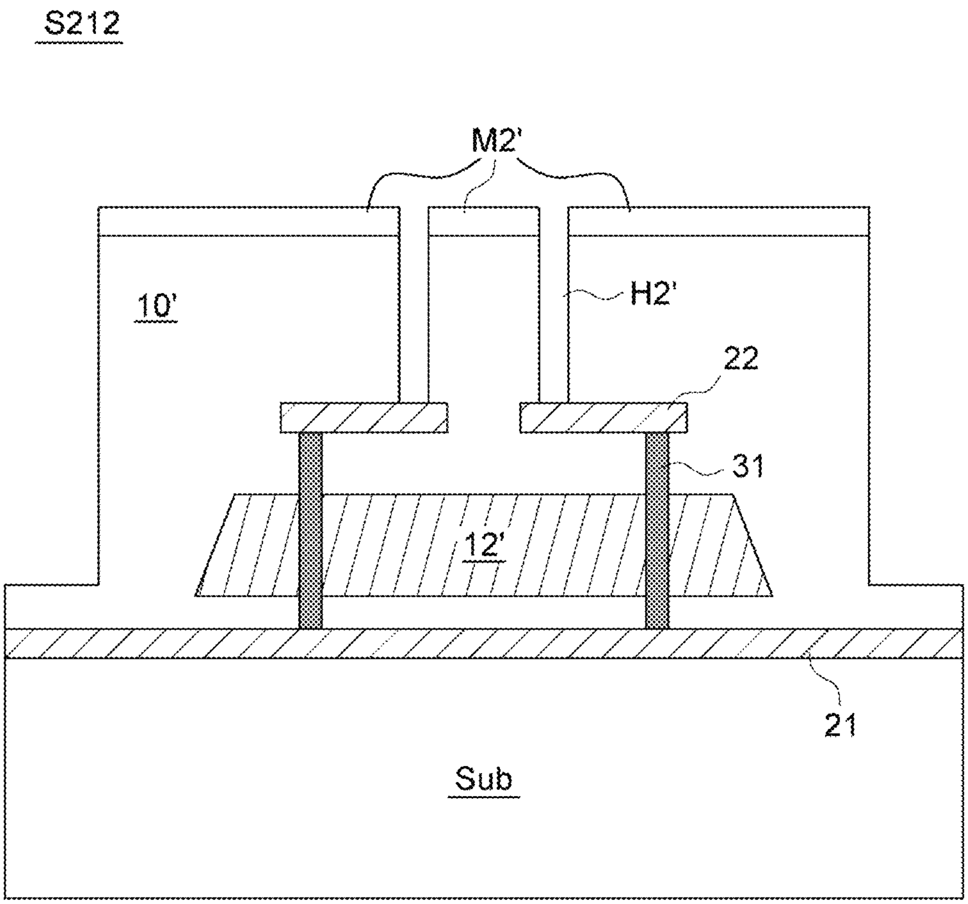
FIG. 32 illustrates a step of forming a second via hole according to the second embodiment of the present invention.

FIG. 32 illustrates a step (S212) of forming the second via hole (H2') according to the second embodiment of the present invention. The second via hole (H2') is formed by etching through the second via mask (M2'). The second via hole (H2') is etched to a depth that exposes the upper surface of the second electrode (22). At the same time, as shown in FIG. 32, the edge region of the fourth elastic layer (14') is preferably etched, leaving only a predetermined thickness.

Figure 33:
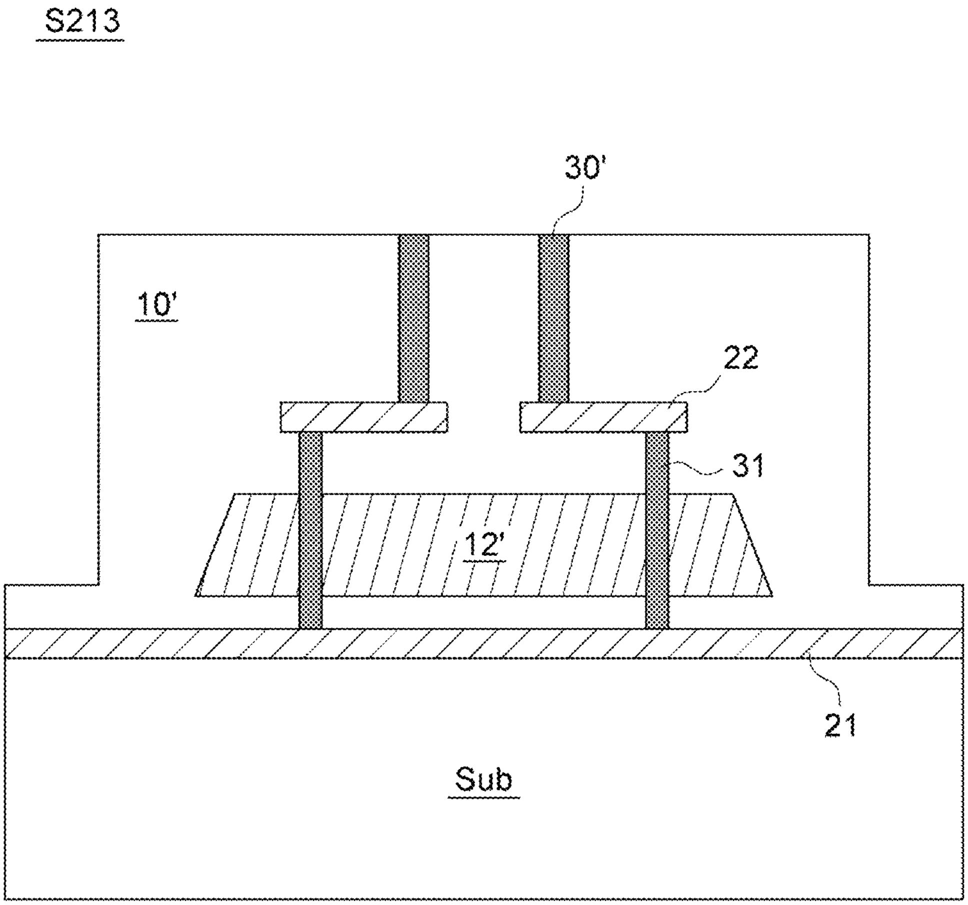
FIG. 33 illustrates a step of forming a probe pin according to the second embodiment of the present invention.

FIG. 33 illustrates a step (S213) of forming a probe pin (30') according to the second embodiment of the present invention. The probe pin (30') is formed by filling metal into the second via hole (H2').

Figure 34:
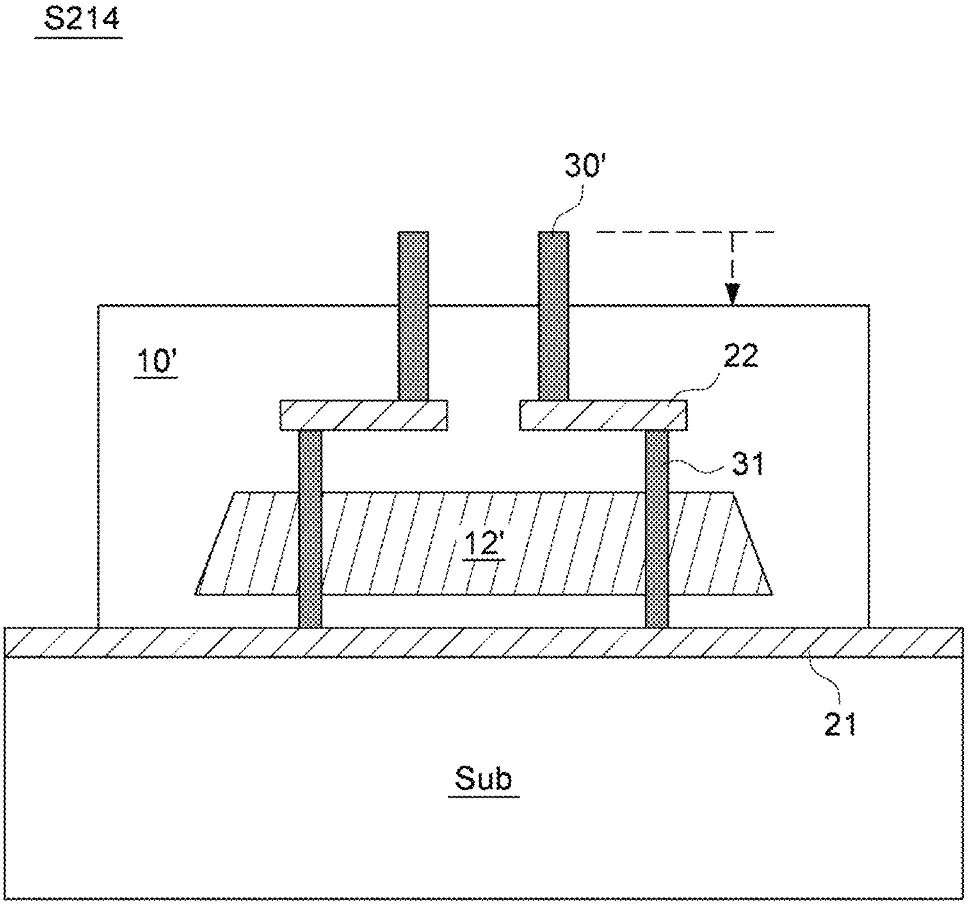
FIG. 34 illustrates a step of protruding an upper portion of a probe pin and a border portion of the first electrode according to the second embodiment of the present invention.

FIG. 34 illustrates a step (S214) of protruding an upper portion of the probe pin (30') and the border portion of the first electrode (21) according to the second embodiment of the present invention. The upper portion of the fourth elastic layer (14') is etched to a predetermined thickness to protrude the upper portion of the probe pin (30'). At the same time, the edge region of the fourth elastic layer (14') is etched, thereby exposing both lateral ends of the first electrode (21) at the side surface of the probe head.

Figure 35:
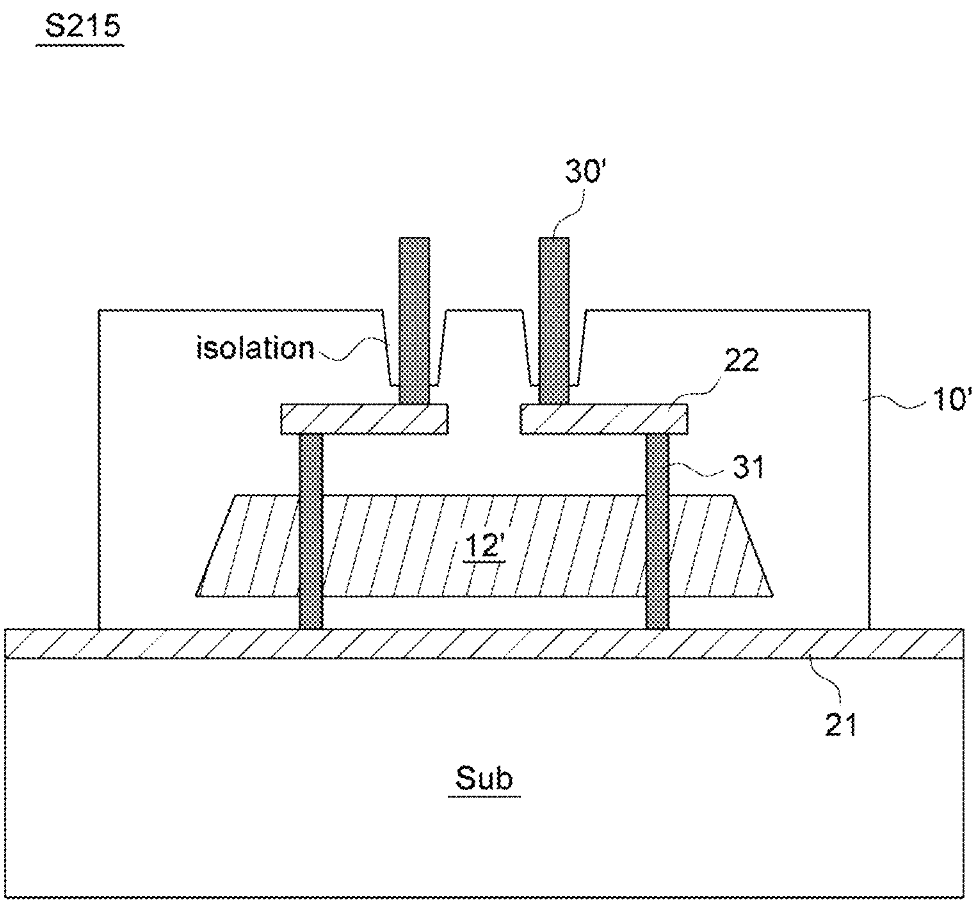
FIG. 35 illustrates a step of forming a groove portion according to the second embodiment of the present invention.

FIG. 35 illustrates a step (S215) of forming a groove portion (isolation) according to the second embodiment of the present invention.

As described above, a groove portion (isolation) may be formed as a preferred embodiment of the present invention. The groove portion (isolation) is formed after the step of protruding the upper portion of the probe pin (30'), by etching the fourth elastic layer (14') within a predetermined width from the outer peripheral surface of the probe pin (30'), such that a part of the outer peripheral surface of the probe pin (30') is spaced apart from the fourth elastic layer (14').

Figure 36:
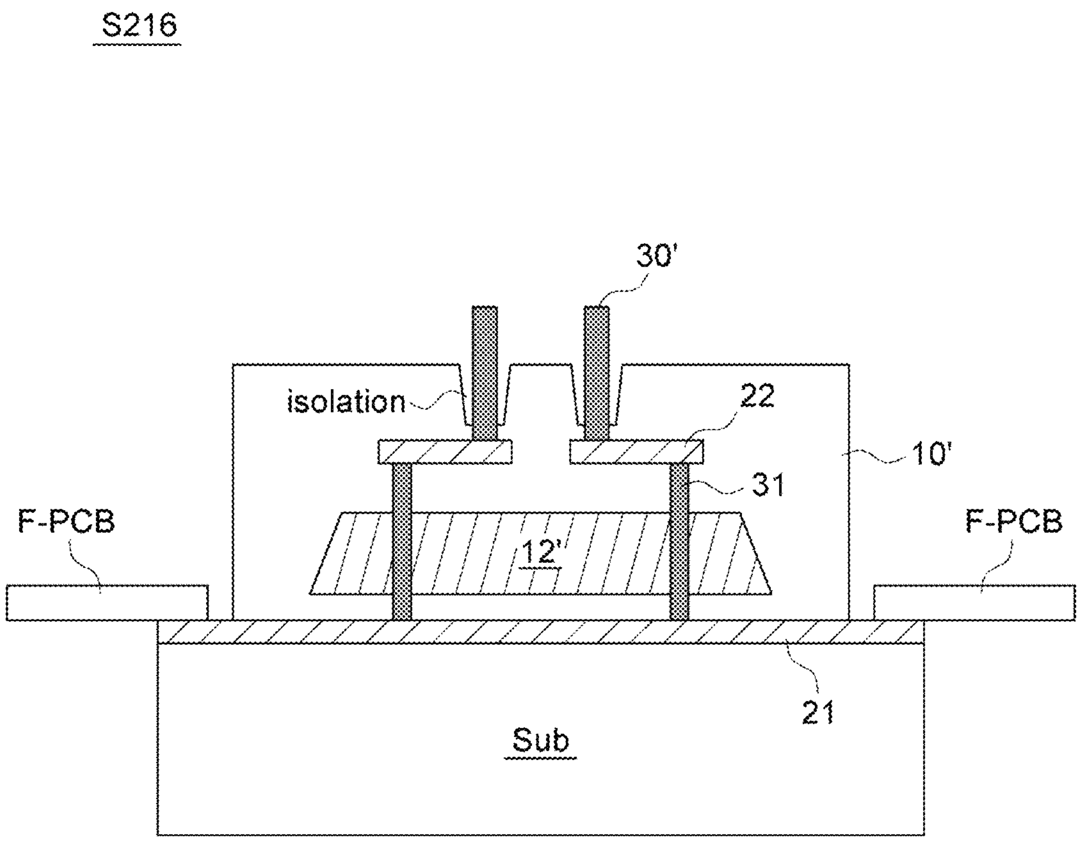
FIG. 36 illustrates a step of connecting a flexible printed circuit board to a first electrode according to the second embodiment of the present invention.

FIG. 36 illustrates a step (S216) of connecting a flexible printed circuit board (F-PCB) to the first electrode (21) according to the second embodiment of the present invention.

Finally, by connecting the flexible printed circuit board (F-PCB) to the exposed portion of the first electrode (21), the fabrication of the probe head according to the second embodiment of the present invention is completed.

The above-described preferred embodiments of the present invention are provided for illustrative purposes, and various modifications, alterations, and additions can be made by those skilled in the art without departing from the spirit and scope of the invention. Such modifications, alterations, and additions should be considered to fall within the scope of the appended claims.

Those skilled in the art will understand that various substitutions, changes, and modifications can be made within the scope of the technical spirit of the present invention, and thus, the present invention is not limited to the aforementioned embodiments and the accompanying drawings.

INDUSTRIAL APPLICABILITY

According to the present invention, it is also possible to inspect a plurality of electronic devices simultaneously, thereby reducing the inspection time required.

In addition, according to the present invention, damage to the device under inspection can be prevented, and the durability of the probe head is increased.

Furthermore, the probe head according to the present invention provides independent elasticity between each probe pin, thereby further improving inspection stability and reliability.

The invention claimed is:

1. A probe head comprising:

an elastic body (10) formed to a predetermined thickness on an upper surface of a substrate;

an electrode portion (20) embedded in the elastic body (10), wherein one end (201) of the electrode portion protrudes beyond a side surface of the elastic body (10);

a probe pin (30) having one end connected to the other end (203) of the electrode portion (20) and the other end protruding upward through the elastic body (10); and a second elastic layer (12) embedded in the elastic body (10) and positioned below the other end (203) of the electrode portion (20), wherein the elastic body (10) is made of a material having a lower coefficient of thermal expansion than the second elastic layer (12).

2. The probe head of claim 1, wherein the second elastic layer (12) has a shape in which its width increases from top to bottom.

3. The probe head of claim 2, wherein the height of the other end (203) of the electrode portion (20) is higher than the height of the one end (201), and an inclined portion (202) is formed between the one end (201) and the other end (203), with the height gradually increasing from the one end (201) to the other end (203).

4. The probe head of claim 1, wherein the elastic body (10) includes an isolation groove formed to be spaced a predetermined distance from an outer circumferential surface of the probe pin (30).

5. A probe head comprising:

an elastic body (10') formed to a predetermined thickness on an upper surface of a substrate;

a first electrode (21) formed on the upper surface of the substrate, located below the elastic body (10'), and having both lateral ends protruding beyond the sides of the elastic body (10');

a second electrode (22) embedded in the elastic body (10') and located above the first electrode (21);

a via electrode (31) vertically penetrating the elastic body (10') from one end of the second electrode (22) to electrically connect to an upper surface of the first electrode (21);

a probe pin (30') having one end connected to the other end of the second electrode (22) and the other end protruding upward through the elastic body (10'); and a second elastic layer (12') embedded in the elastic body (10'), and located above the first electrode (21) and below the second electrode (22), wherein the elastic body (10') is made of a material having a lower coefficient of thermal expansion than the second elastic layer (12').

6. The probe head of claim 5, wherein the second elastic layer (12') has a shape in which its width increases from top to bottom.

7. The probe head of claim 5, wherein the via electrode (31) vertically penetrates the second elastic layer (12').

8. The probe head of claim 5, wherein the elastic body (10') includes an isolation groove formed to be spaced a predetermined distance from an outer circumferential surface of the probe pin (30').

9. A method of manufacturing a probe head comprising:

laminating a first elastic layer (11) on an upper surface of a substrate;

laminating a second elastic layer (12) on an upper surface of the first elastic layer (11);

etching the first elastic layer (11) and the second elastic layer (12) to form a slope;

laminating a third elastic layer (13) on the substrate, the slope, and an upper surface of the second elastic layer (12);

depositing metal on the upper surface of the third elastic layer (13) to form an electrode portion (20);

laminating a fourth elastic layer (14) on the electrode portion (20) and the third elastic layer (13);

forming a hole mask on the fourth elastic layer (14), and etching to a depth that reaches the electrode portion (20) to form a via hole (H1);

filling the via hole (H1) with metal to form a probe pin (30); and etching an upper portion of the fourth elastic layer (14) to a predetermined thickness to expose an upper portion of the probe pin (30).

10. The method of claim 9, wherein the first elastic layer (11) is made of a material having a lower coefficient of thermal expansion than the second elastic layer (12).

11. The method of claim 9, further comprising:

after exposing the upper portion of the probe pin (30), etching the fourth elastic layer (14) within a predetermined width from an outer circumferential surface of the probe pin (30) to separate a portion of the outer surface of the probe pin (30) from the fourth elastic layer (14).

12. A method of manufacturing a probe head comprising:

depositing a first electrode (21) on an upper surface of a substrate;

laminating a first elastic layer (11') on the first electrode (21);

laminating a second elastic layer (12') on the first elastic layer (11');

etching the first and second elastic layers (11', 12') to form a slope;

laminating a third elastic layer (13') on the substrate, the slope, and an upper surface of the second elastic layer (12');

forming a first via mask (M1') on the third elastic layer (13'), masking all areas except a region for a first via hole (H1') and an edge region;

etching the third elastic layer (13') through the first via mask (M1') to vertically form the first via hole (H1') and expose an edge portion of the first electrode (21);

filling the first via hole (H1') with metal to form a via electrode (31);

depositing a second electrode (22) on the via electrode (31) and the third elastic layer (13');

laminating a fourth elastic layer (14') on the second electrode (22) and the third elastic layer (13');

forming a second via mask (M2') on the fourth elastic layer (14'), masking all areas except a region for a second via hole (H2') and an edge region;

etching the fourth elastic layer (14') through the second via mask (M2') to form the second via hole (H2') vertically from the second electrode (22);

filling the second via hole (H2') with metal to form a probe pin (30'); and etching the upper portion of the fourth elastic layer (14') to expose an upper portion of the probe pin (30') and an edge portion of the first electrode (21).

13. The method of claim 12, wherein the first elastic layer (11') is made of a material having a lower coefficient of thermal expansion than the second elastic layer (12').

14. The method of claim 12, further comprising:

after exposing the upper portion of the probe pin (30'), etching the fourth elastic layer (14') within a predetermined width from an outer circumferential surface of the probe pin (30') to separate a portion of the outer surface of the probe pin (30') from the fourth elastic layer (14').

* * * * *